(12) United States Patent
Misawa

(10) Patent No.: US 6,677,998 B1
(45) Date of Patent: Jan. 13, 2004

(54) SOLID-STATE ELECTRONIC IMAGE SENSING DEVICE AND METHOD OF CONTROLLING OPERATION OF SAME

(75) Inventor: Takeshi Misawa, Asaka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/492,093

(22) Filed: Jan. 27, 2000

(30) Foreign Application Priority Data

Jan. 25, 1999  (JP) .......................... 11-015138

(51) Int. Cl.⁷ .......................... H04N 3/14; H04N 5/335; H01L 27/00
(52) U.S. Cl. .................. 348/312; 348/317; 348/322; 250/208.1
(58) Field of Search .................. 348/311, 312, 348/317, 319, 320, 322, 324, 294, 272, 280; 250/208.1

(56) References Cited

U.S. PATENT DOCUMENTS

| | | | | |
|---|---|---|---|---|
| 5,251,036 A | * | 10/1993 | Kawaoka et al. | 348/311 |
| 5,748,232 A | * | 5/1998 | Konuma | 348/311 |
| 5,966,174 A | * | 10/1999 | Yamamoto et al. | 348/319 |
| 6,169,577 B1 | * | 1/2001 | Iizuka | 348/317 |
| 6,342,921 B1 | * | 1/2002 | Yamaguchi et al. | 348/322 |
| 6,583,818 B1 | * | 6/2003 | Toma | 348/317 |
| 2001/0048477 A1 | * | 12/2001 | Misawa | 348/275 |

FOREIGN PATENT DOCUMENTS

JP        11122535 A    *  4/1999    .......... H04N/5/335

* cited by examiner

Primary Examiner—Wendy R. Garber
Assistant Examiner—John M Villecco
(74) Attorney, Agent, or Firm—Birch, Stewart, Kolasch & Birch, LLP

(57) ABSTRACT

Subsampling of data is performed at a high subsampling rate in an image sensing device such as a CCD. Signal lines for applying transfer pulses to transfer gates in the device are connected so as to apply gate pulses simultaneously to transfer gates for photodiodes of (n+1)th, (n+5)th and (n+13)th rows, apply gate pulses simultaneously to transfer gates for photodiodes of an (n+2)th row, apply gate pulses simultaneously to transfer gates for photodiodes of (n+3)th, (n+7)th, (n+11)th and (n+15)th rows, apply gate pulses simultaneously to transfer gates for photodiodes of (n+4)th, (n+8)th, (n+12)th and (n+16)th rows, apply gate pulses simultaneously to transfer gates for photodiodes of (n+6)th, (n+10)th and (n+14)th rows, and apply gate pulses simultaneously to transfer gates for photodiodes of an (n+9)th row.

6 Claims, 27 Drawing Sheets

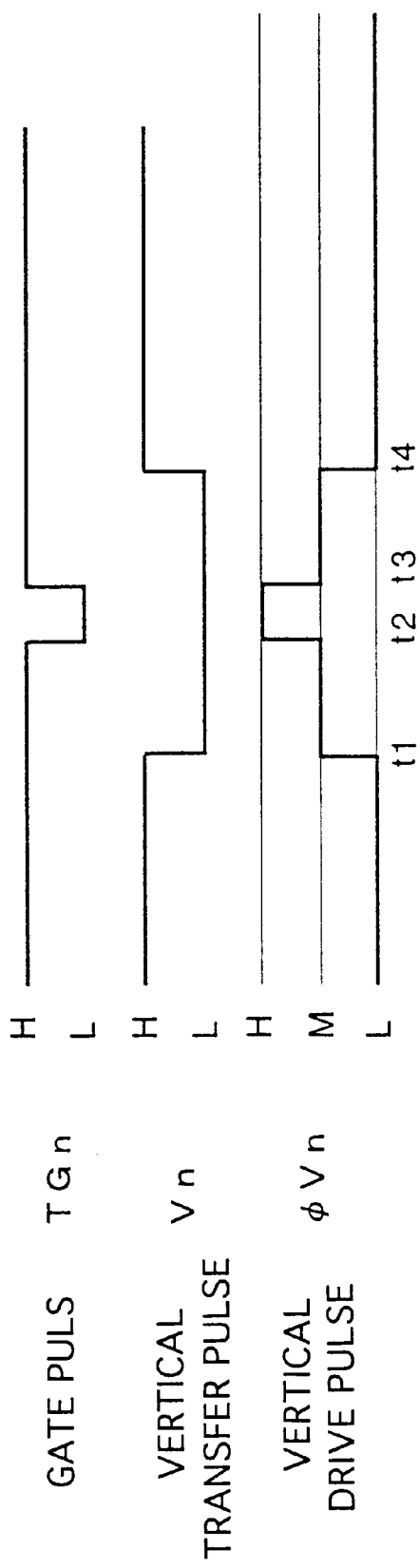

Fig. 4

| VERTICAL TRANSFER ELECTRODES | | VERTICAL DRIVE PULSES ϕVn | |
|---|---|---|---|
| | | FIRST FIELD | SECOND FIELD |
| (n+1)th ROW [(m+1)th ROW] | E1b | ○ | |
| | E2 | | |
| (n+2)th ROW [(m+2)th ROW] | E3a | | ○ |
| | E4 | | |
| (n+3)th ROW [(m+3)th ROW] | E5 | ○ | |
| | E6 | | |
| (n+4)th ROW [(m+4)th ROW] | E7 | | ○ |
| | E8 | | |
| (n+5)th ROW [(m+1)th ROW] | E1b | ○ | |
| | E2 | | |
| (n+6)th ROW [(m+2)th ROW] | E3b | | ○ |
| | E4 | | |
| (n+7)th ROW [(m+3)th ROW] | E5 | ○ | |
| | E6 | | |
| (n+8)th ROW [(m+4)th ROW] | E7 | | ○ |
| | E8 | | |
| (n+9)th ROW [(m+1)th ROW] | E1a | ○ | |
| | E2 | | |
| (n+10)th ROW [(m+2)th ROW] | E3b | | ○ |
| | E4 | | |
| (n+11)th ROW [(m+3)th ROW] | E5 | ○ | |
| | E6 | | |
| (n+12)th ROW [(m+4)th ROW] | E7 | | ○ |
| | E8 | | |
| (n+13)th ROW [(m+1)th ROW] | E1b | ○ | |
| | E2 | | |
| (n+14)th ROW [(m+2)th ROW] | E3b | | ○ |
| | E4 | | |
| (n+15)th ROW [(m+3)th ROW] | E5 | ○ | |
| | E6 | | |
| (n+16)th ROW [(m+4)th ROW] | E7 | - | ○ |
| | E8 | | |

Fig. 12

| VERTICAL TRANSFER ELECTRODES | | VERTICAL DRIVE PULSES φVn | |
|---|---|---|---|
| | | FIRST FIELD | SECOND FIELD |
| (n+1)th ROW [(m+1)th ROW] | E1b | ○ | |
| | E2 | | |
| (n+2)th ROW [(m+2)th ROW] | E3a | ○ | |
| | E4 | | |
| (n+3)th ROW [(m+3)th ROW] | E5 | | ○ |
| | E6 | | |
| (n+4)th ROW [(m+4)th ROW] | E7 | | ○ |
| | E8 | | |
| (n+5)th ROW [(m+1)th ROW] | E1b | ○ | |
| | E2 | | |
| (n+6)th ROW [(m+2)th ROW] | E3b | ○ | |
| | E4 | | |
| (n+7)th ROW [(m+3)th ROW] | E5 | | ○ |
| | E6 | | |
| (n+8)th ROW [(m+4)th ROW] | E7 | | ○ |
| | E8 | | |
| (n+9)th ROW [(m+1)th ROW] | E1a | ○ | |
| | E2 | | |
| (n+10)th ROW [(m+2)th ROW] | E3b | ○ | |
| | E4 | | |
| (n+11)th ROW [(m+3)th ROW] | E5 | | ○ |
| | E6 | | |
| (n+12)th ROW [(m+4)th ROW] | E7 | | ○ |
| | E8 | | |
| (n+13)th ROW [(m+1)th ROW] | E1b | ○ | |
| | E2 | | |
| (n+14)th ROW [(m+2)th ROW] | E3b | ○ | |
| | E4 | | |
| (n+15)th ROW [(m+3)th ROW] | E5 | | ○ |
| | E6 | | |
| (n+16)th ROW [(m+4)th ROW] | E7 | | ○ |
| | E8 | | |

*Fig. 20*

| | VERTICAL TRANSFER ELECTRODES | VERTICAL DRIVE PULSES $\phi Vn$ |
|---|---|---|
| (n+1)th ROW [(m+1)th ROW] | E1b | |
| | E2 | |
| (n+2)th ROW [(m+2)th ROW] | E3a | |
| | E4 | |
| (n+3)th ROW [(m+3)th ROW] | E5 | ○ |
| | E6 | |
| (n+4)th ROW [(m+4)th ROW] | E7 | ○ |
| | E8 | |
| (n+5)th ROW [(m+1)th ROW] | E1b | |
| | E2 | |
| (n+6)th ROW [(m+2)th ROW] | E3b | |
| | E4 | |
| (n+7)th ROW [(m+3)th ROW] | E5 | ○ |
| | E6 | |
| (n+8)th ROW [(m+4)th ROW] | E7 | ○ |
| | E8 | |
| (n+9)th ROW [(m+1)th ROW] | E1a | |
| | E2 | |
| (n+10)th ROW [(m+2)th ROW] | E3b | |
| | E4 | |
| (n+11)th ROW [(m+3)th ROW] | E5 | ○ |
| | E6 | |
| (n+12)th ROW [(m+4)th ROW] | E7 | ○ |
| | E8 | |
| (n+13)th ROW [(m+1)th ROW] | E1b | |
| | E2 | |
| (n+14)th ROW [(m+2)th ROW] | E3b | |
| | E4 | |
| (n+15)th ROW [(m+3)th ROW] | E5 | ○ |
| | E6 | |
| (n+16)th ROW [(m+4)th ROW] | E7 | ○ |
| | E8 | |

Fig. 22

| Vertical Transfer Electrodes | | Vertical Drive Pulses $\phi Vn$ |
|---|---|---|
| (n+1)th ROW [(m+1)th ROW] | E1b | ○ |
| | E2 | |
| (n+2)th ROW [(m+2)th ROW] | E3a | ○ |
| | E4 | |
| (n+3)th ROW [(m+3)th ROW] | E5 | |
| | E6 | |
| (n+4)th ROW [(m+4)th ROW] | E7 | |
| | E8 | |
| (n+5)th ROW [(m+1)th ROW] | E1b | ○ |
| | E2 | |
| (n+6)th ROW [(m+2)th ROW] | E3b | ○ |
| | E4 | |
| (n+7)th ROW [(m+3)th ROW] | E5 | |
| | E6 | |
| (n+8)th ROW [(m+4)th ROW] | E7 | |
| | E8 | |
| (n+9)th ROW [(m+1)th ROW] | E1a | ○ |
| | E2 | |
| (n+10)th ROW [(m+2)th ROW] | E3b | ○ |
| | E4 | |
| (n+11)th ROW [(m+3)th ROW] | E5 | |
| | E6 | |
| (n+12)th ROW [(m+4)th ROW] | E7 | |
| | E8 | |
| (n+13)th ROW [(m+1)th ROW] | E1b | ○ |
| | E2 | |
| (n+14)th ROW [(m+2)th ROW] | E3b | ○ |
| | E4 | |
| (n+15)th ROW [(m+3)th ROW] | E5 | |
| | E6 | |
| (n+16)th ROW [(m+4)th ROW] | E7 | |
| | E8 | |

*Fig. 24*

| VERTICAL TRANSFER ELECTRODES | | VERTICAL DRIVE PULSES φVn | | | |
|---|---|---|---|---|---|
| | | FIRST FIELD | SECOND FIELD | THIRD FIELD | FOURTH FIELD |
| (n+1)th ROW [(m+1)th ROW] | E1b | ○ | | | |
| | E2 | | | | |
| (n+2)th ROW [(m+2)th ROW] | E3a | | ○ | | |
| | E4 | | | | |
| (n+3)th ROW [(m+3)th ROW] | E5 | | | ○ | |
| | E6 | | | | |
| (n+4)th ROW [(m+4)th ROW] | E7 | | | | ○ |
| | E8 | | | | |
| (n+5)th ROW [(m+1)th ROW] | E1b | ○ | | | |
| | E2 | | | | |
| (n+6)th ROW [(m+2)th ROW] | E3b | | ○ | | |
| | E4 | | | | |
| (n+7)th ROW [(m+3)th ROW] | E5 | | | ○ | |
| | E6 | | | | |
| (n+8)th ROW [(m+4)th ROW] | E7 | | | | ○ |
| | E8 | | | | |
| (n+9)th ROW [(m+1)th ROW] | E1a | ○ | | | |
| | E2 | | | | |
| (n+10)th ROW [(m+2)th ROW] | E3b | | ○ | | |
| | E4 | | | | |
| (n+11)th ROW [(m+3)th ROW] | E5 | | | ○ | |
| | E6 | | | | |
| (n+12)th ROW [(m+4)th ROW] | E7 | | | | ○ |
| | E8 | | | | |
| (n+13)th ROW [(m+1)th ROW] | E1b | ○ | | | |
| | E2 | | | | |
| (n+14)th ROW [(m+2)th ROW] | E3b | | ○ | | |
| | E4 | | | | |
| (n+15)th ROW [(m+3)th ROW] | E5 | | | ○ | |
| | E6 | | | | |
| (n+16)th ROW [(m+4)th ROW] | E7 | | | | ○ |
| | E8 | | | | |

Fig. 33

| Vertical Transfer Electrodes | Vertical Drive Pulses φVn First Field | Second Field |
|---|---|---|
| (n+1)th ROW [(m+1)th ROW] E1b | | |
| E2 | | |
| (n+2)th ROW [(m+2)th ROW] E3a | | |
| E4 | | |
| (n+3)th ROW [(m+3)th ROW] E5 | ○ | |
| E6 | | |
| (n+4)th ROW [(m+4)th ROW] E7 | | ○ |
| E8 | | |
| (n+5)th ROW [(m+1)th ROW] E1b | | |
| E2 | | |
| (n+6)th ROW [(m+2)th ROW] E3b | | |
| E4 | | |
| (n+7)th ROW [(m+3)th ROW] E5 | ○ | |
| E6 | | |
| (n+8)th ROW [(m+4)th ROW] E7 | | ○ |
| E8 | | |
| (n+9)th ROW [(m+1)th ROW] E1a | | |
| E2 | | |
| (n+10)th ROW [(m+2)th ROW] E3b | | |
| E4 | | |
| (n+11)th ROW [(m+3)th ROW] E5 | ○ | |
| E6 | | |
| (n+12)th ROW [(m+4)th ROW] E7 | | ○ |
| E8 | | |
| (n+13)th ROW [(m+1)th ROW] E1b | | |
| E2 | | |
| (n+14)th ROW [(m+2)th ROW] E3b | | |
| E4 | | |
| (n+15)th ROW [(m+3)th ROW] E5 | ○ | |
| E6 | | |
| (n+16)th ROW [(m+4)th ROW] E7 | | ○ |
| E8 | | |

Fig. 34

| VERTICAL TRANSFER ELECTRODES | | VERTICAL DRIVE PULSES $\phi Vn$ | |
|---|---|---|---|
| | | FIRST FIELD | SECOND FIELD |
| (n+1)th ROW [(m+1)th ROW] | E1b | ○ | |
| | E2 | | |
| (n+2)th ROW [(m+2)th ROW] | E3a | | |
| | E4 | | |
| (n+3)th ROW [(m+3)th ROW] | E5 | | |
| | E6 | | |
| (n+4)th ROW [(m+4)th ROW] | E7 | | ○ |
| | E8 | | |
| (n+5)th ROW [(m+1)th ROW] | E1b | ○ | |
| | E2 | | |
| (n+6)th ROW [(m+2)th ROW] | E3b | | |
| | E4 | | |
| (n+7)th ROW [(m+3)th ROW] | E5 | | |
| | E6 | | |
| (n+8)th ROW [(m+4)th ROW] | E7 | | ○ |
| | E8 | | |
| (n+9)th ROW [(m+1)th ROW] | E1a | ○ | |
| | E2 | | |
| (n+10)th ROW [(m+2)th ROW] | E3b | | |
| | E4 | | |
| (n+11)th ROW [(m+3)th ROW] | E5 | | |
| | E6 | | |
| (n+12)th ROW [(m+4)th ROW] | E7 | | ○ |
| | E8 | | |
| (n+13)th ROW [(m+1)th ROW] | E1b | ○ | |
| | E2 | | |
| (n+14)th ROW [(m+2)th ROW] | E3b | | |
| | E4 | | |
| (n+15)th ROW [(m+3)th ROW] | E5 | | |
| | E6 | | |
| (n+16)th ROW [(m+4)th ROW] | E7 | | ○ |
| | E8 | | |

Fig. 35

| Row | VERTICAL TRANSFER ELECTRODES | VERTICAL DRIVE PULSES $\phi Vn$ |
|---|---|---|
| (n+1)th ROW [(m+1)th ROW] | E1b | |
| | E2 | |
| (n+2)th ROW [(m+2)th ROW] | E3a | ○ |
| | E4 | |
| (n+3)th ROW [(m+3)th ROW] | E5 | |
| | E6 | |
| (n+4)th ROW [(m+4)th ROW] | E7 | |
| | E8 | |
| (n+5)th ROW [(m+1)th ROW] | E1b | |
| | E2 | |
| (n+6)th ROW [(m+2)th ROW] | E3b | |
| | E4 | |
| (n+7)th ROW [(m+3)th ROW] | E5 | |
| | E6 | |
| (n+8)th ROW [(m+4)th ROW] | E7 | |
| | E8 | |
| (n+9)th ROW [(m+1)th ROW] | E1a | ○ |
| | E2 | |
| (n+10)th ROW [(m+2)th ROW] | E3b | |
| | E4 | |
| (n+11)th ROW [(m+3)th ROW] | E5 | |
| | E6 | |
| (n+12)th ROW [(m+4)th ROW] | E7 | |
| | E8 | |
| (n+13)th ROW [(m+1)th ROW] | E1b | |
| | E2 | |
| (n+14)th ROW [(m+2)th ROW] | E3b | |
| | E4 | |
| (n+15)th ROW [(m+3)th ROW] | E5 | |
| | E6 | |
| (n+16)th ROW [(m+4)th ROW] | E7 | |
| | E8 | |

SOLID-STATE ELECTRONIC IMAGE SENSING DEVICE AND METHOD OF CONTROLLING OPERATION OF SAME

BACKGROUND OF THE INVENTION

1. Field of the Invention

This invention relates to a solid-state electronic image sensing device having a number of photodiodes formed in row and column directions, vertical transfer paths formed adjacent to photodiodes in the row direction and in which vertical transfer electrodes have been formed, and transfer gates for transferring signal charge, which has accumulated in the photodiodes, to the vertical transfer paths.

2. Description of the Related Art

In digital still cameras and the like having a solid-state electronic image sensing device such as a CCD as image sensing means, image data having a high image quality needs to be obtained when the image data is recorded on a recording medium. Such high-quality image data is not necessarily required at the time of autoexposure (AE), autofocus (AF) and when shooting a subject for the purpose of displaying the image of the subject on a display device provided on the digital still camera.

Greater numbers of pixels are being used to construct solid-state image sensing devices. When the number of pixels is not that large, the device is driven by the same drive method regardless of whether the camera is performing autoexposure or autofocus, shooting a picture of a subject or recording a video signal representing the image of the subject on a recording medium.

With the trend toward use of greater numbers of pixels in solid-state electronic image sensing devices, however, driving the solid-state electronic image sensing device by the same drive method at all times means that signal processing such as AE and AF processing and processing for displaying the image of the subject on the display device cannot be performed in rapid fashion. As a consequence, image data representing the image of a subject cannot be recorded on the recording medium promptly, possibly resulting in the loss of photographic opportunities.

Though it has been contemplated to subsample the video signal output by the solid-state electronic image sensing device to thereby reduce the quantity of video output by the solid-state electronic image sensing device and speed up image processing, it is difficult to raise the degree of subsampling.

DISCLOSURE OF THE INVENTION

Accordingly, an object of the present invention is to raise the degree of subsampling.

According to the present invention, the foregoing object is attained by providing a solid-state electronic image sensing device having a number of photodiodes formed in row and column directions, vertical transfer paths formed adjacent to photodiodes in the row direction and in which vertical transfer electrodes have been formed, and transfer gates for transferring signal charge, which has accumulated in the photodiodes, to the vertical transfer paths, wherein signal lines for applying gate pulses to the transfer gates are connected so as to apply gate pulses simultaneously to transfer gates for photodiodes of (n+1)th, (n+5)th and (n+13)th rows, apply gate pulses simultaneously to transfer gates for photodiodes of an (n+2)th row, apply gate pulses simultaneously to transfer gates for photodiodes of (n+3)th, (n+7)th, (n+11)th and (n+15)th rows, apply gate pulses simultaneously to transfer gates for photodiodes of (n+4)th, (n+8)th, (n+12)th and (n+16)th rows, apply gate pulses simultaneously to transfer gates for photodiodes of (n+6)th, (n+10)th and (n+14)th rows, and apply gate pulses simultaneously to transfer gates for photodiodes of an (n+9)th row.

The present invention provides also an operation control method suited to the above-described solid-state electronic image sensing device. Specifically, the present invention provides a method of controlling the operation of a solid-state electronic image sensing device having a number of photodiodes formed in row and column directions, vertical transfer paths formed adjacent to photodiodes in the row direction and in which vertical transfer electrodes have been formed, and transfer gates for transferring signal charge, which has accumulated in the photodiodes, to the vertical transfer paths, comprising the steps of: applying gate pulses simultaneously to transfer gates for photodiodes of (n+1)th, (n+5)th and (n+13)th rows; applying gate pulses simultaneously to transfer gates for photodiodes of an (n+2)th row; applying gate pulses simultaneously to transfer gates for photodiodes of (n+3)th, (n+7)th, (n+11)th and (n+15)th rows; applying gate pulses simultaneously to transfer gates for photodiodes of (n+4)th, (n+8)th, (n+12)th and (n+16)th rows; applying gate pulses simultaneously to transfer gates for photodiodes of (n+6)th, (n+10)th and (n+14)th rows; and applying gate pulses simultaneously to transfer gates for photodiodes of an (n+9)th row.

Subsampling so as to halve the amount of data is achieved by applying gate pulses to transfer gates for photodiodes in odd- or even-numbered rows. Interlacing is achieved by alternating the application of gate pulses to transfer gates for the photodiodes in the odd-numbered rows with the application of gate pulses to transfer gates for the photodiodes in the even-numbered rows.

Subsampling to halve the amount of data can be achieved even if gate pulses are applied simultaneously to the transfer gates for photodiodes in two rows among (m+1)th, (m+2)th, (m+3)th and (m+4)th rows in odd-numbered fields and simultaneously to transfer gates for photodiodes of (m+1)th, (m+2)th, (m+3)th and (m+4)th rows in even-numbered fields with the exception of those transfer gates of rows to which gate pulses were applied in the odd-numbered fields.

Subsampling to halve the amount of data can be achieved also by applying gate pulses simultaneously to transfer gates for photodiodes in two rows among (m+1)th, (m+2)th, (m+3)th and (m+4)th rows regardless of whether rows are odd- or even-numbered.

Subsampling to reduce the amount of data to one-fourth can be achieved by applying gate pulses simultaneously to transfer gates for photodiodes in one row of (m+1)th, (m+2)th, (m+3)th and (m+4)th rows.

Subsampling to reduce the amount of data to one-eighth can be achieved by applying gate pulses simultaneously to transfer gates for photodiodes of (n+2)th and (n+9)th rows.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 3 is a time chart illustrating the relationship among a gate pulse, a vertical transfer pulse and a vertical drive pulse;

FIG. 4 is a diagram illustrating the relationship between vertical transfer electrodes and vertical drive pulses applied to these vertical transfer electrodes;

FIG. 12 is a diagram illustrating the relationship between vertical transfer electrodes and vertical drive pulses applied to these vertical transfer electrodes;

FIG. 20 is a diagram illustrating the relationship between vertical transfer electrodes and vertical drive pulses applied to these vertical transfer electrodes;

FIG. 22 is a diagram illustrating the relationship between vertical transfer electrodes and vertical drive pulses applied to these vertical transfer electrodes;

FIG. 24 is a diagram illustrating the relationship between vertical transfer electrodes and vertical drive pulses applied to these vertical transfer electrodes;

FIG. 33 is a diagram illustrating the relationship between vertical transfer electrodes and vertical drive pulses applied to these vertical transfer electrodes;

FIG. 34 is a diagram illustrating the relationship between vertical transfer electrodes and vertical drive pulses applied to these vertical transfer electrodes;

FIG. 35 is a diagram illustrating the relationship between vertical transfer electrodes and vertical drive pulses applied to these vertical transfer electrodes;

DESCRIPTION OF THE PREFERRED EMBODIMENT

An embodiment of the present invention will now be described in detail with reference to the accompanying drawings.

Figure 1:
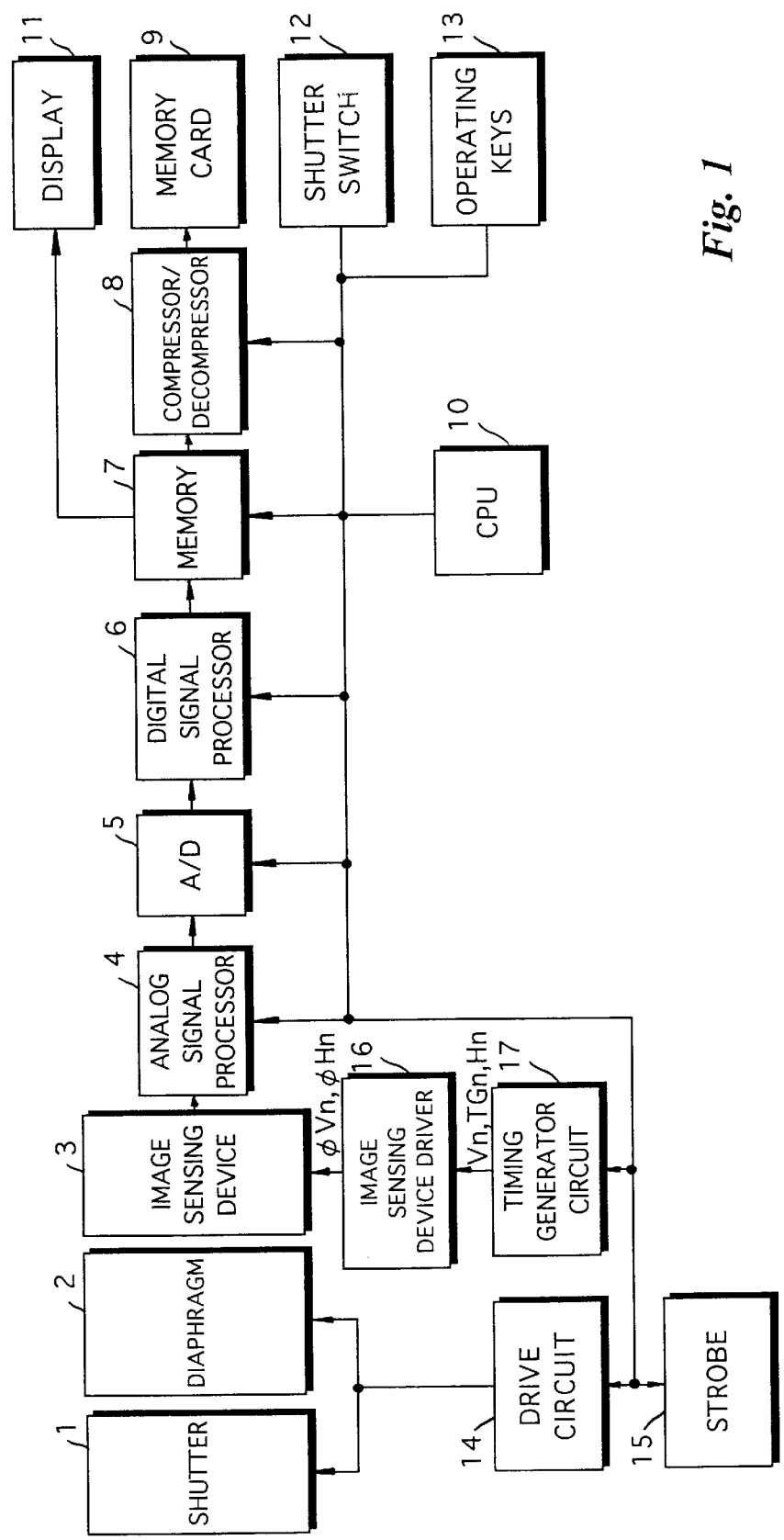
FIG. 1 is a block diagram illustrating the electrical structure of an electronic still camera.

FIG. 1 is a block diagram illustrating the electrical structure of an electronic still camera according to an embodiment of the present invention.

As shown in FIG. 1, the electronic still camera includes a CPU 10 for controlling the overall operation of the camera, a shutter switch 12 and operating keys 13 which provide the CPU 10 with input signals representing the settings of the switch and keys. The camera is capable of strobe photography and for this purpose includes a strobe device 15 driven by a drive circuit 14.

The image of a subject is formed on the photoreceptor surface of an image sensing device (CCD) 3 by a taking lens (not shown) via a shutter and diaphragm 2.

A timing generator circuit 17 outputs a vertical transfer pulse Vn, a gate pulse TGn and a horizontal transfer pulse Hn, which are applied to an image sensing device driver 16. The latter produces a vertical drive pulse $\phi$Vn and a horizontal drive pulse $\phi$Hn from the vertical transfer pulse Vn, gate pulse TGn and horizontal transfer pulse Hn input thereto. The vertical drive pulse $\phi$Vn and horizontal drive pulse $\phi$Hn are applied to the image sensing device 3. The image sensing device 3 outputs a video signal, which represents the image of a subject, and inputs this signal to an analog signal processing circuit 4.

The analog signal processing circuit 4 executes signal processing such as a gamma correction and color balance adjustment. The processed video signal is input to an analog/digital converter circuit 5, which converts the analog video signal to digital image data.

On the basis of the digital image data, a digital signal processing circuit 6 produces luminance data Y and color difference data B−Y and R−Y. The luminance data Y and color difference data B−Y and R−Y is input to a display device 11 via a memory 7. The image of a subject obtained by image sensing is displayed on the display screen of the display device 11.

When the shutter switch 12 is pressed, image data output from the digital signal processing circuit 6 is stored in the memory 7 temporarily. The luminance data Y and color difference data B−Y and R−Y that has been stored in the memory 7 is read out and input to a compression/decompression circuit 8, where this data undergoes data compression. The compressed image data is then applied to a memory card 9, where the data is recorded.

Figure 2:
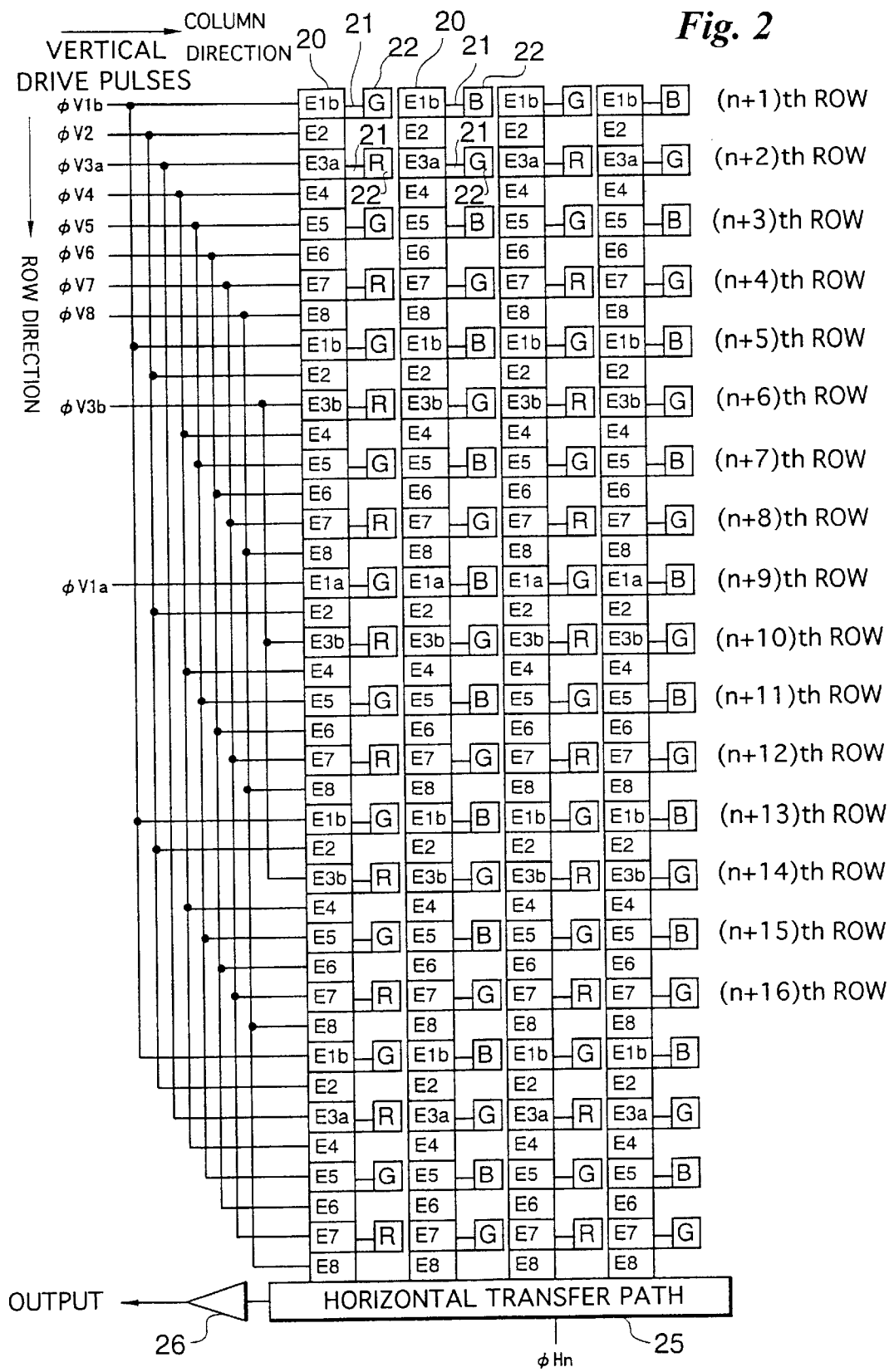
FIG. 2 is a diagram illustrating part of an image sensing device.

FIG. 2 illustrates part of the image sensing device 3. The latter includes a number of photodiodes 22 formed in row and column directions. Each photodiode 22 has a color filter formed on its photoreceptor surface. The color filters are a blue filter (indicated by "B") that allows the transmission of a blue light component, a green filter (indicated by "G") that allows the transmission of a green light component, and a red filter (indicated by "R") that allows the transmission of a red light component. The array of these filters is referred to as a "Bayer array". It goes without saying, however, that the filter array is not limited to the Bayer array (and the filters may be monochromatic).

A vertical transfer path 20 for transferring signal charge is formed in the row direction adjacent to each column of the photodiodes 22. The number of vertical transfer paths 20 formed corresponds to the number of columns of photodiodes 22. Formed between each vertical transfer path 20 and the adjacent photodiodes 22 are transfer gates 21 for transferring signal charge, which has accumulated in the photodiodes 22, to the vertical transfer path 20. Vertical transfer electrodes are formed in each vertical transfer path 20 in order to transfer signal charge, which has been transferred from the photodiodes 22, in the row direction. Two vertical transfer electrodes are formed to correspond to one photodiode 22 (the one photodiode 22 corresponds to one pixel). Signal charge is transferred in the row direction within the vertical transfer path 20 by applying the vertical transfer pulses φVn to the vertical transfer electrodes.

Vertical transfer electrodes E1b and E2 are formed to correspond to the photodiodes 22 of an (n+1)th row, vertical transfer electrodes E3a and E4 are formed to correspond to the photodiodes 22 of an (n+2)th row, vertical transfer electrodes E5 and E6 are formed to correspond to the photodiodes 22 of an (n+3)th row, vertical transfer electrodes E7 and E8 are formed to correspond to the photodiodes 22 of an (n+4)th row, vertical transfer electrodes E1b and E2 are formed to correspond to the photodiodes 22 of an (n+5)th row, vertical transfer electrodes E3b and E4 are formed to correspond to the photodiodes 22 of an (n+6)th row, vertical transfer electrodes E5 and E6 are formed to correspond to the photodiodes 22 of an (n+7)th row, and vertical transfer electrodes E7 and E8 are formed to correspond to the photodiodes 22 of an (n+8)th row.

Vertical transfer electrodes E1a and E2 are formed to correspond to the photodiodes 22 of an (n+9)th row, vertical transfer electrodes E3b and E4 are formed to correspond to the photodiodes 22 of an (n+10)th row, vertical transfer electrodes E5 and E6 are formed to correspond to the photodiodes 22 of an (n+11)th row, vertical transfer electrodes E7 and E8 are formed to correspond to the photodiodes 22 of an (n+12)th row, vertical transfer electrodes E1b and E2 are formed to correspond to the photodiodes 22 of an (n+13)th row, vertical transfer electrodes E3b and E4 are formed to correspond to the photodiodes 22 of an (n+14)th row, vertical transfer electrodes E5 and E6 are formed to correspond to the photodiodes 22 of an (n+15)th row, and vertical transfer electrodes E7 and E8 are formed to correspond to the photodiodes 22 of an (n+16)th row.

This arrangement of the electrodes of each vertical transfer path 20 for the photodiodes 22 of the (n+1)th to (n+16)th rows is cyclic.

Signal lines are formed for providing the vertical transfer electrodes with the vertical drive pulses φVn and horizontal drive pulses φHn output by the image sensing device driver 16. Signal lines are formed in such a manner that vertical drive pulses φV1b, φV2, φV3a, φV4, φV5, φV6, φV7, φV8, φV3b and φV1a are applied to the vertical transfer electrodes E1b, E2, E3a, E4, E5, E6, E7, E8, E3b and E1a, respectively. More specifically, the signal lines are connected so as to apply vertical drive pulses (gate pulses) simultaneously to the transfer gates 21 for the photodiodes of the (n+1)th, (n+5)th and (n+13)th rows, apply vertical drive pulses simultaneously to the transfer gates 21 for the photodiodes of the (n+2)th row, apply vertical drive pulses simultaneously to the transfer gates 21 for the photodiodes of the (n+3)th, (n+7)th, (n+11)th and (n+15)th rows, apply vertical drive pulses simultaneously to the transfer gates 21 for the photodiodes of the (n+4)th, (n+8)th, (n+12)th and (n+16)th rows, apply vertical drive pulses simultaneously to the transfer gates 21 for the photodiodes 22 of the (n+6)th, (n+10)th and (n+14)th rows, and apply vertical drive pulses simultaneously to the transfer gates 21 for the photodiodes 22 of the (n+9)th row.

A horizontal transfer path 25 for transferring signal charge, which has been output from the vertical transfer paths 20, in the horizontal direction is provided on the output side (lower side) of the vertical transfer paths 20. The signal charge is transferred in the horizontal direction by applying the horizontal drive pulse φHn from the image sensing device driver 16 to the horizontal transfer path 25.

The signal charge that has been output from the horizontal transfer path 25 is applied to an amplifier circuit 26. The signal charge is amplified by the amplifier circuit 26 and output from the image sensing device 3 as a video signal representing the image of the subject.

FIG. 3 is a time chart illustrating the relationship among the gate pulse TGn and vertical transfer pulse Vn output from the timing generator circuit 17 and the vertical drive pulse φVn output from the image sensing device driver 16.

The gate pulse TGn and vertical transfer pulse Vn take on two levels, namely H and L levels, and the vertical drive pulse φVn takes on three levels, namely H, M and L levels. When the vertical transfer pulse Vn assumes the L level at time t1, the vertical drive pulse φVn rises from the L to the M level. When the gate pulse TGn falls from the H to the L level at such time that the vertical transfer pulse Vn is at the L level, the vertical drive pulse φVn rises to the H level. When the gate pulse Tgn rises from the L to the H level at time t3, the vertical drive pulse φVn returns to the M level. When the vertical drive pulse Vn attains the H level at time t4, the vertical drive pulse φVn reverts to the L level.

The vertical drive pulses φVn are applied to the vertical transfer electrodes formed in each vertical transfer path 20. When the vertical drive pulse φVn rises to the H level, a transfer gate 21 turns on so that the signal charge that has accumulated in the corresponding photodiode 22 is transferred to the vertical transfer path 20. When the vertical drive pulse φVn attains the M level, the signal charge is transferred within the vertical transfer path 20. The transfer of signal charge, which has accumulated in a photodiode 22, to the vertical transfer path 20 and the transfer of signal charge within the vertical transfer path 20 can be controlled using the gate pulse TGn and vertical transfer pulse Vn.

FIGS. 4 to 11 illustrate first read-out processing when a video signal is read out of the image sensing device 3 of the kind depicted in FIG. 2. In first read-out processing, signal charge is read out of photodiodes 22 of odd-numbered rows in a first field and signal charge is read out of photodiodes 22 of even-numbered rows in a second field.

Figure 5:
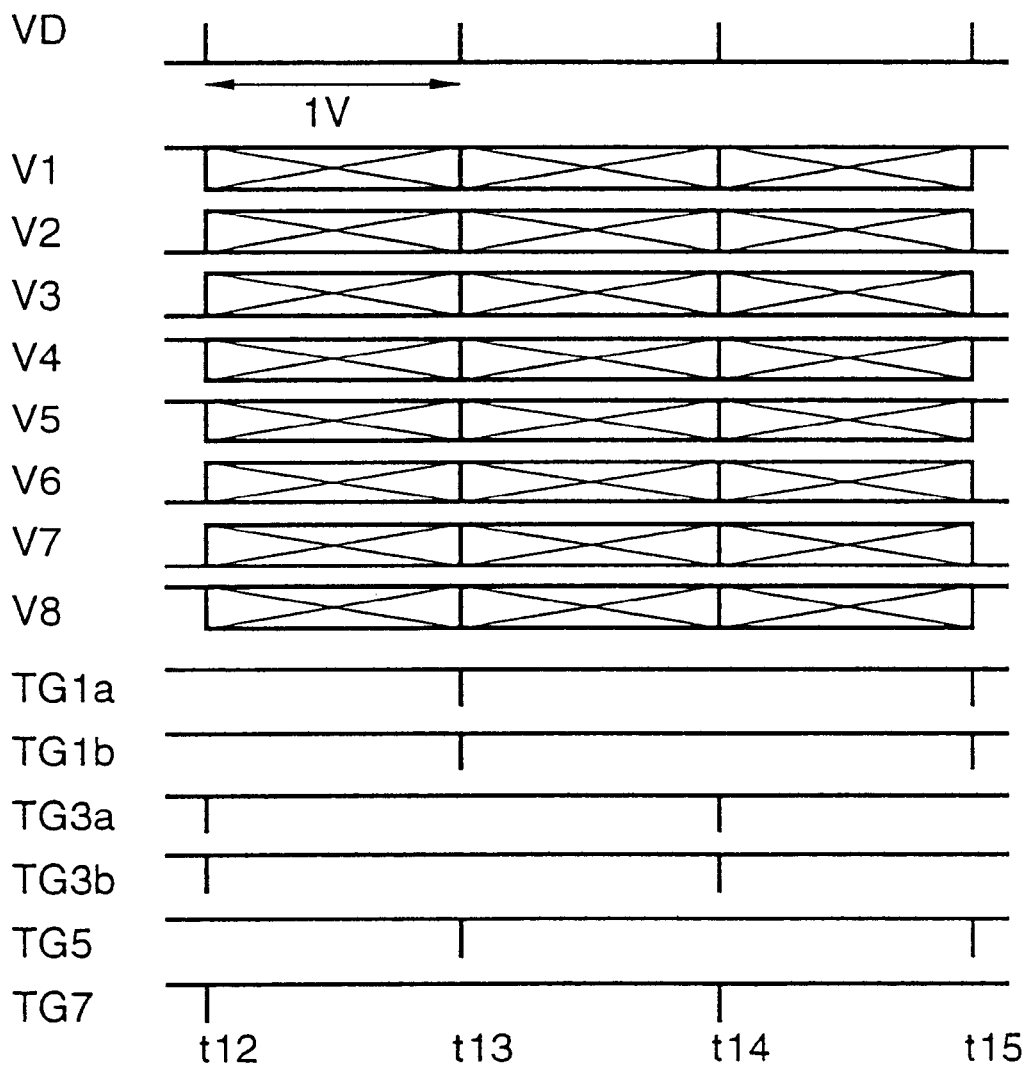
FIG. 5 is a time chart illustrating the relationship among a vertical synchronizing signal, vertical transfer pulses and transfer gate pulses.

FIG. 4 is a diagram illustrating the relationship between vertical transfer electrodes and vertical drive pulses φVn applied to these vertical transfer electrodes. FIG. 5 is a time chart illustrating the relationship among a vertical synchronizing signal VD, the vertical transfer pulses Vn and the gate pulses TGn.

Figure 6:
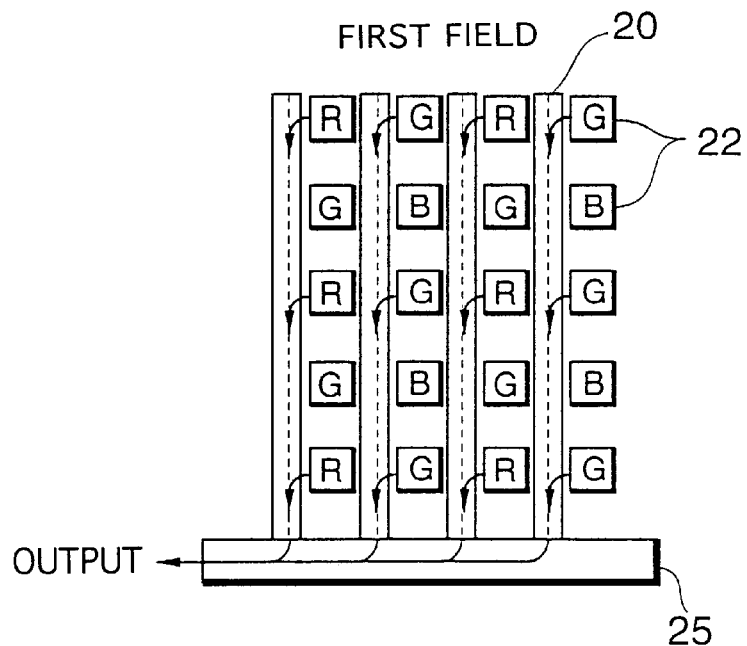
FIG. 6 is a diagram illustrating part of an image sensing device.
Figure 7:
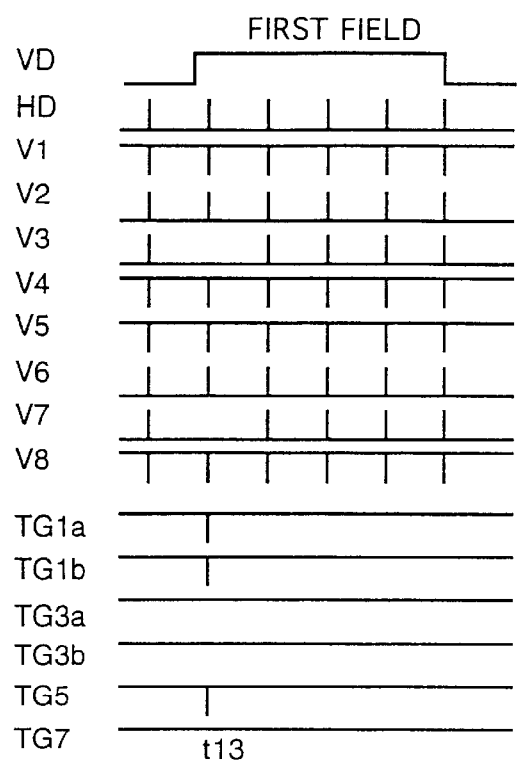
FIG. 7 is a time chart illustrating the relationship among a vertical synchronizing signal, vertical transfer pulses and transfer gate pulses.
Figure 8:
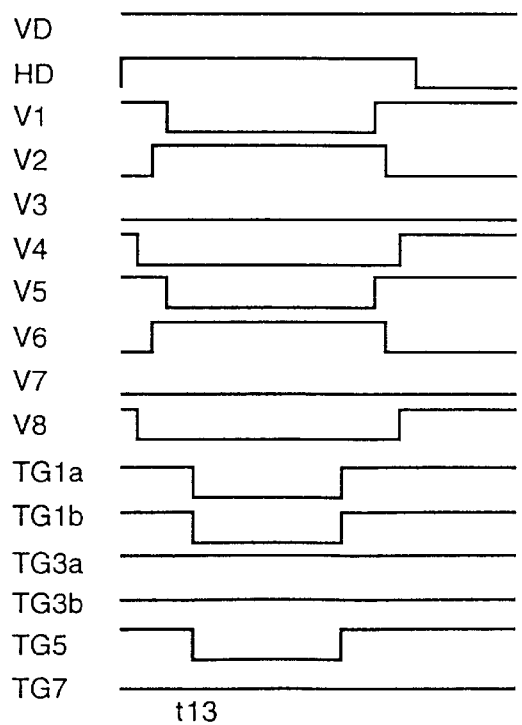
FIG. 8 shows the time chart of FIG. 7 in partially enlarged form.

FIG. 6 is a diagram illustrating part of the image sensing device 3 and shows the manner in which signal charge, which has accumulated in the photodiodes 22 of the odd-numbered rows, is read out, FIG. 7 is a time chart which prevails at read-out of signal charge that has accumulated in photodiodes of the odd-numbered rows, and FIG. 8 shows the time chart of FIG. 7 in partially enlarged form (in the vicinity of time t13).

Figure 9:
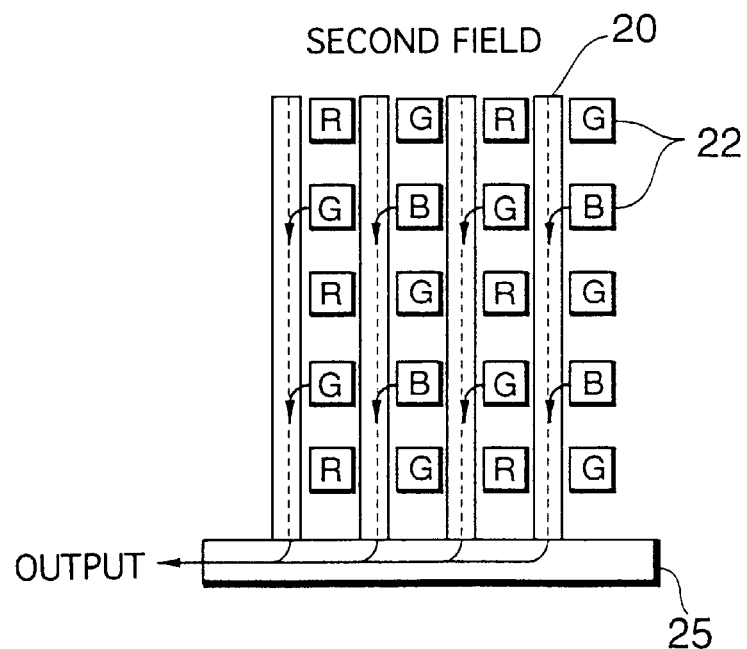
FIG. 9 is a diagram illustrating part of the image sensing device.
Figure 10:
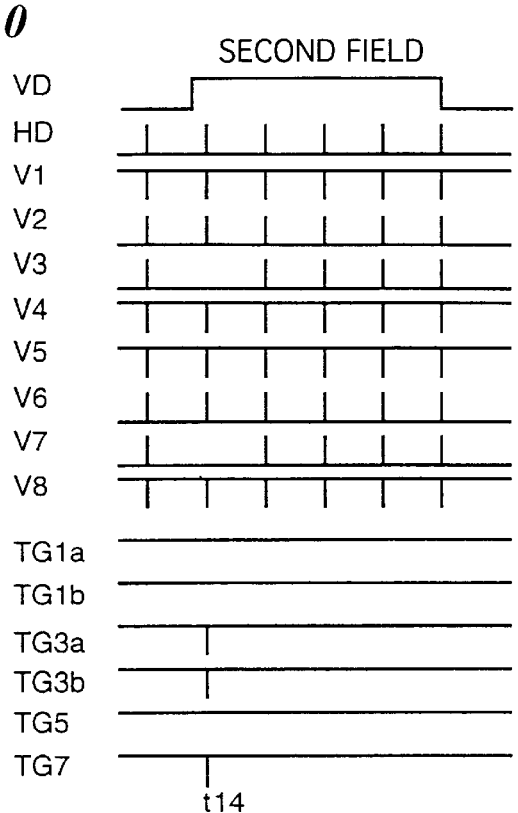
FIG. 10 is a time chart illustrating the relationship among a vertical synchronizing signal, vertical transfer pulses and transfer gate pulses.
Figure 11:
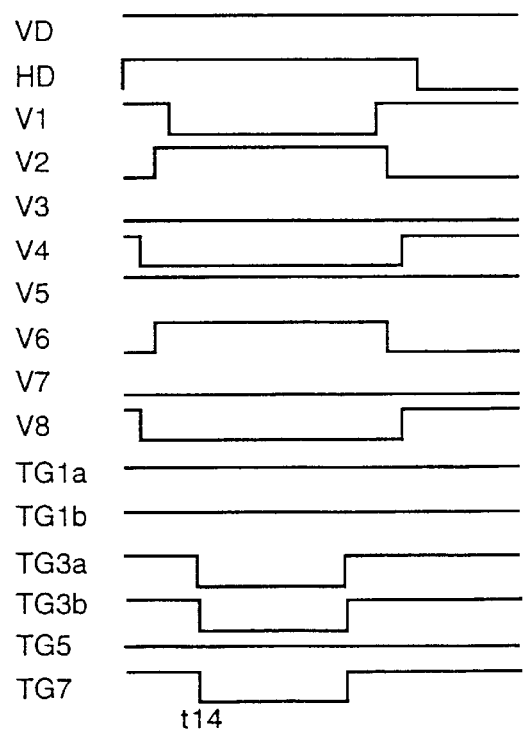
FIG. 11 shows the time chart of FIG. 10 in partially enlarged form.

FIG. 9 is a diagram illustrating part of the image sensing device 3 and shows the manner in which signal charge, which has accumulated in the photodiodes 22 of the even-numbered rows, is read out, FIG. 10 is a time chart which prevails at read-out of signal charge that has accumulated in photodiodes of the even-numbered rows, and FIG. 11 shows the time chart of FIG. 10 in partially enlarged form (in the vicinity of time t14).

In the first field, transfer gate pulses TG1a, TG1b and TG7 are applied to the vertical transfer electrodes E1a, E1b and E5 (H-level vertical drive pulses are applied to the vertical transfer electrodes E1a, E1b and E5) in sync with the vertical synchronizing signal VD, which rises at time t13. In the second field, the transfer gate pulses TG1a, TG1b and TG7 are applied to the vertical transfer electrodes E3a, E3b and E7 in sync with the vertical synchronizing signal VD, which rises at time t14. Thus, the application of the transfer gate pulses to the vertical transfer electrodes E1a, E1b and E5 alternates with the application of the transfer gate pulses to the vertical transfer electrodes E3a, E3b and E7 field by field.

When transfer gate pulses TG1a, TG1b and TG5 are applied to the vertical transfer electrodes E1a, E1b and E5 at time t13, signal charge that has accumulated in the photodiodes 22 of the odd-numbered rows is transferred to the vertical transfer paths 20. Signal charge that has been transferred to the vertical transfer paths 20 is transferred in the vertical direction by applying the vertical drive pulses φVn (vertical transfer pulses Vn) to the vertical transfer electrodes formed in the vertical transfer paths 20. The signal charge is applied from the vertical transfer paths 20 to the horizontal transfer path 25. The signal charge is then transferred horizontally within the horizontal transfer path 25 and output as a video signal.

When transfer gate pulses TG3a, TG3b and TG7 are applied to the vertical transfer electrodes E3a, E3b and E7 at time t14 of the second field, signal charge that has accumulated in the photodiodes 22 of the even-numbered rows is transferred to the vertical transfer paths 20. Signal charge that has been transferred to the vertical transfer paths 20 is transferred in the vertical direction by applying the vertical drive pulses φVn to the vertical transfer electrodes formed in the vertical transfer paths 20. The signal charge is output as a video signal via the horizontal transfer path 25. This operation is similar to that in the case of the first field.

Signal charge that has accumulated in the photodiodes 22 of the odd-numbered rows is output in the first field and signal charge that has accumulated in the photodiodes 22 of the even-numbered rows is output in the second field. Interlaced read-out is thus achieved. Further, the video signal output from the image sensing device 3 is such that the number of pixels in the vertical direction is subsampled to one-half in each of the first and second fields.

FIGS. 12 to 19 illustrate second read-out processing when a video signal is read out of the image sensing device 3 depicted in FIG. 2. In second read-out processing, signal charge that has been stored in the photodiodes 22 of (m+1)th and (m+2)th rows is read out in the first field, and signal charge that has been stored in the photodiodes 22 of (m+3)th and (m+4)th rows is read out in the second field.

Figure 13:
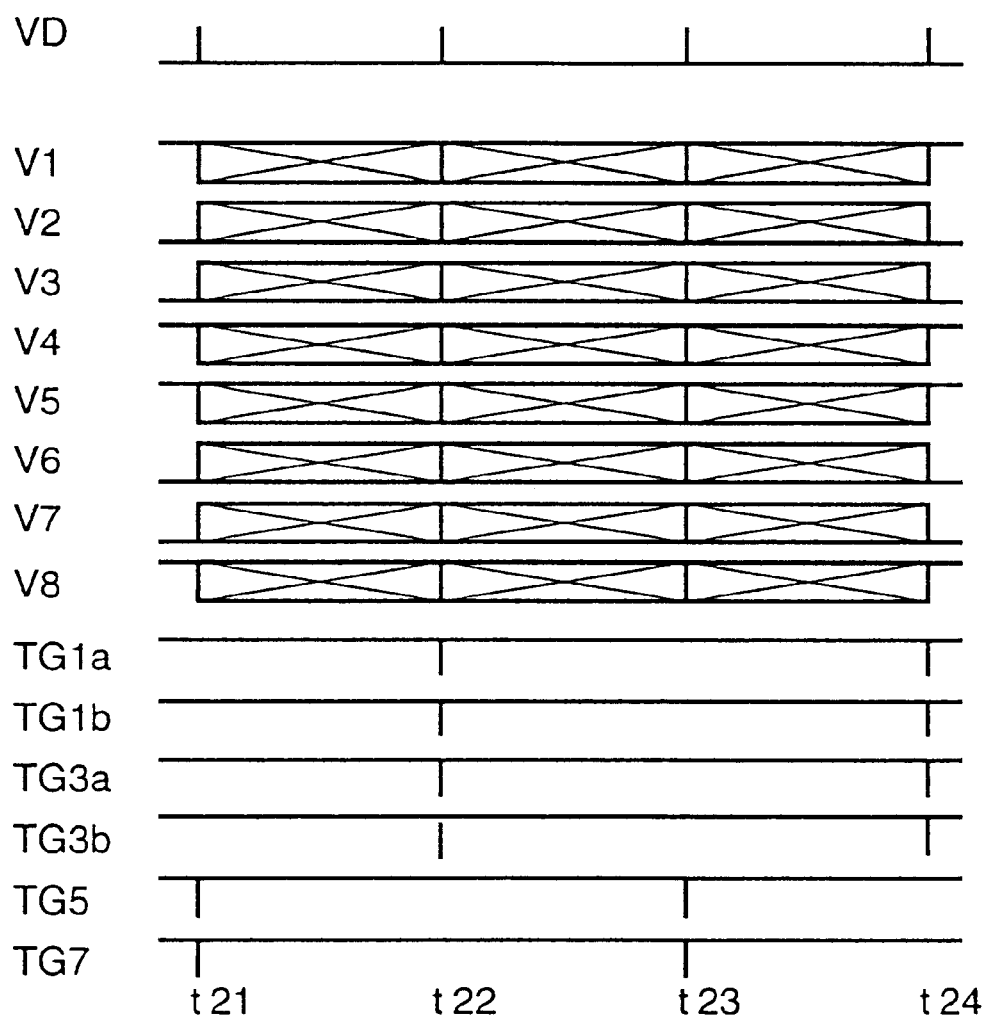
FIG. 13 is a time chart illustrating the relationship among a vertical synchronizing signal, vertical transfer pulses and transfer gate pulses.

FIG. 12 is a diagram illustrating the relationship between vertical transfer electrodes and vertical drive pulses φVn applied to these vertical transfer electrodes, and FIG. 13 is a time chart illustrating the relationship among the vertical synchronizing signal VD, the vertical transfer pulses Vn and the gate pulses TGn.

Figure 14:
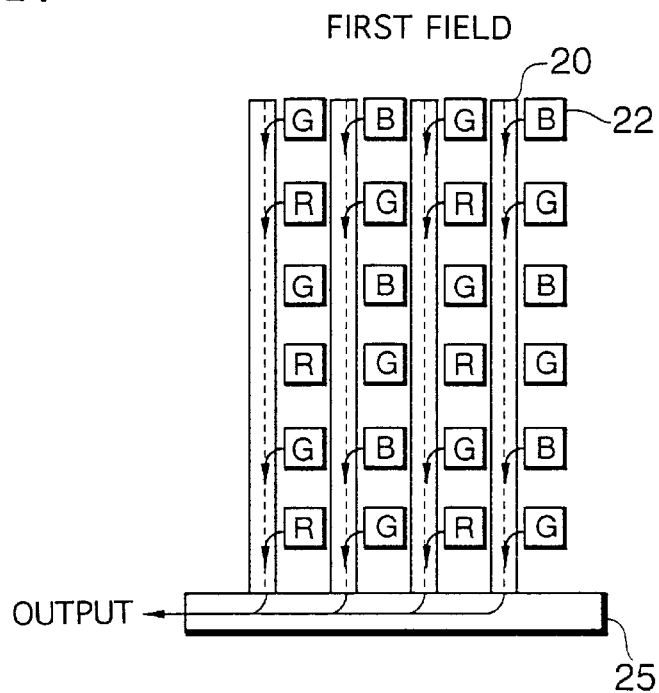
FIG. 14 is a diagram illustrating part of an image sensing device.
Figure 15:
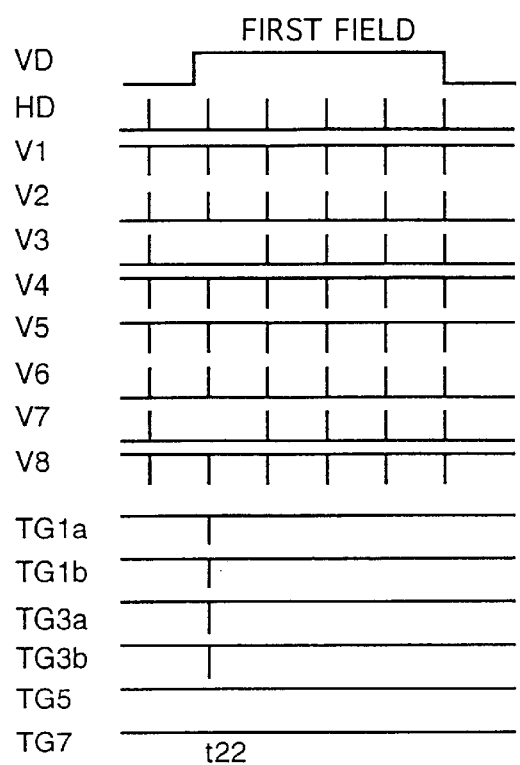
FIG. 15 is a time chart illustrating the relationship among a vertical synchronizing signal, vertical transfer pulses and transfer gate pulses.
Figure 16:
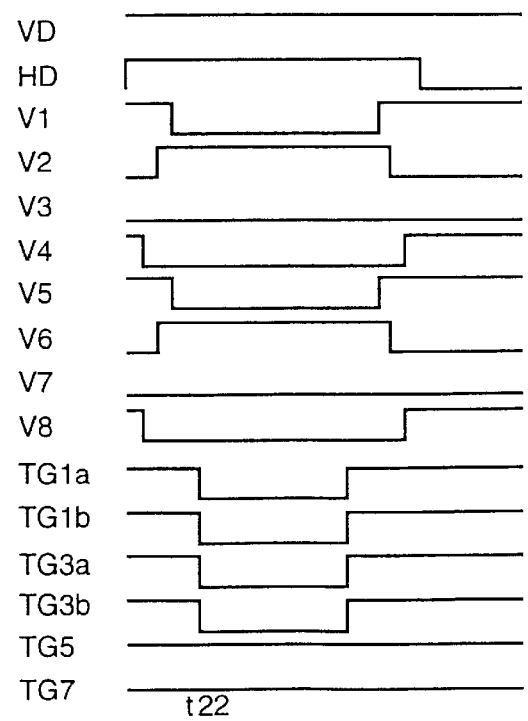
FIG. 16 shows the time chart of FIG. 15 in partially enlarged form.

FIG. 14 is a diagram illustrating part of the image sensing device 3 and shows the manner in which signal charge, which has accumulated in the photodiodes 22 of the odd-numbered rows, is read out, FIG. 15 is a time chart which prevails at read-out of signal charge that has accumulated in the photodiodes 22 of the (m+1)th and (m+2)th rows, and FIG. 16 shows the time chart of FIG. 15 in partially enlarged form (in the vicinity of time t22).

Figure 17:
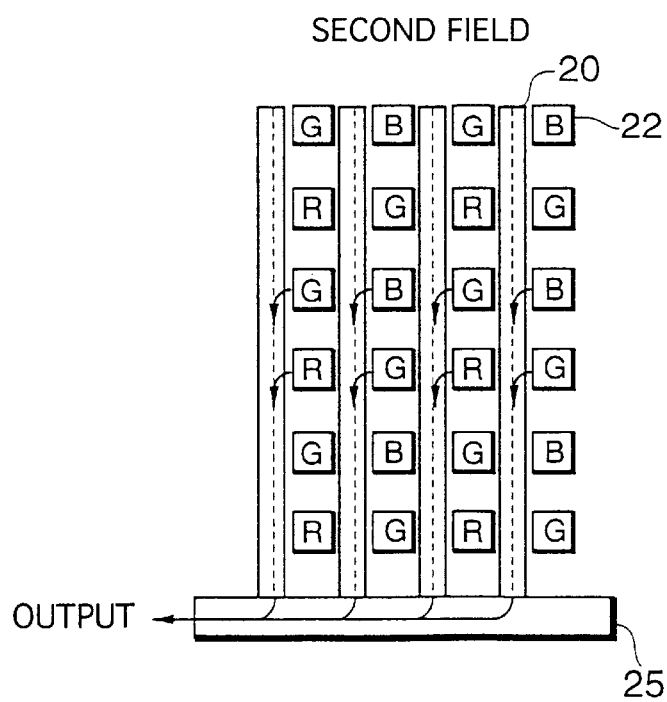
FIG. 17 is a diagram illustrating part of an image sensing device.
Figure 18:
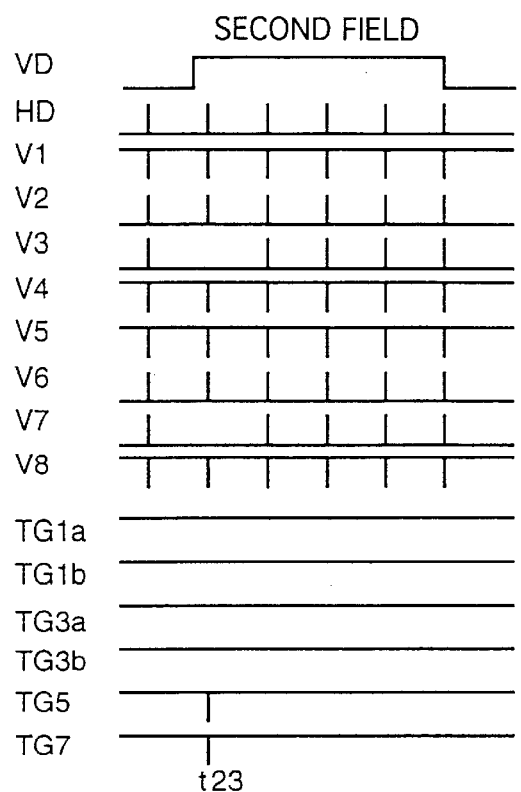
FIG. 18 is a time chart illustrating the relationship among a vertical synchronizing signal, vertical transfer pulses and transfer gate pulses.
Figure 19:
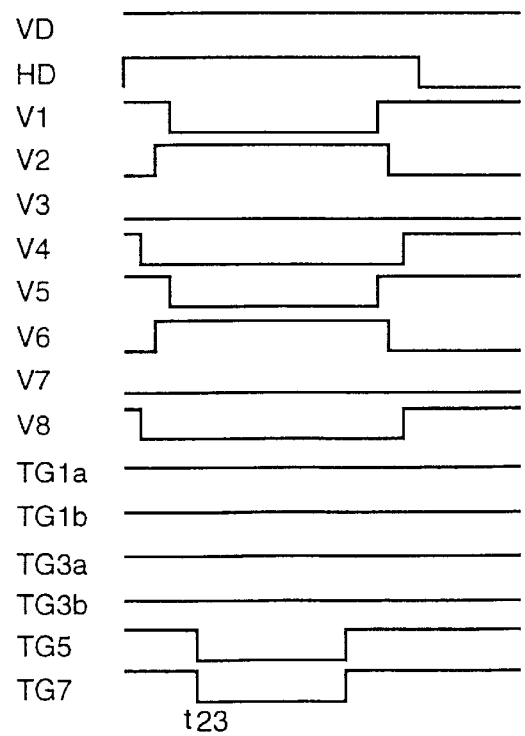
FIG. 19 shows the time chart of FIG. 18 in partially enlarged form.

FIG. 17 is a diagram illustrating part of the image sensing device 3 and shows the manner in which signal charge, which has accumulated in the photodiodes 22 of the even-numbered rows, is read out, FIG. 18 is a time chart which prevails at read-out of signal charge that has accumulated in the photodiodes of the (m+3)th and (m+4)th rows, and FIG. 19 shows the time chart of FIG. 18 in partially enlarged form (in the vicinity of time t23).

In the first field, transfer gate pulses TG1a, TG1b, TG3a and TG3b are applied to the vertical transfer electrodes E1a, E1b and E3b (H-level vertical drive pulses are applied to the vertical transfer electrodes E1a, E1b, E3a and E3b) in sync with the vertical synchronizing signal VD, which rises at time t22. In the second field, the transfer gate pulses TG5, TG7 are applied to the vertical transfer electrodes E5 and E7 in sync with the vertical synchronizing signal VD, which rises at time t23. Thus, the application of the transfer gate pulses to the vertical transfer electrodes E1a, E1b, E3a and E3b alternates with the application of the transfer gate pulses to the vertical transfer electrodes E5 and E7 field by field.

When transfer gate pulses TG1a, TG1b, TG3a and TG3b are applied to the vertical transfer electrodes E1a, E1b, E3a and E3b at time t22, signal charge that has accumulated in the photodiodes 22 of the (m+1)th and (m+2)th rows is transferred to the vertical transfer paths 20. Signal charge that has been transferred to the vertical transfer paths 20 is transferred in the vertical direction by applying the vertical drive pulses φVn to the vertical transfer electrodes formed in the vertical transfer paths 20. The signal charge is applied from the vertical transfer paths 20 to the horizontal transfer path 25. The signal charge is then transferred horizontally within the horizontal transfer path 25 and output as a video signal.

When transfer gate pulses TG5 and TG7 are applied to the vertical transfer electrodes E5 and E7 at time t23 of the second field, signal charge that has accumulated in the photodiodes 22 of the (m+3)th and (m+4)th rows is transferred to the vertical transfer paths 20. Signal charge that has been transferred to the vertical transfer paths 20 is transferred in the vertical direction by applying the vertical drive pulses φVn to the vertical transfer electrodes formed in the vertical transfer paths 20. The signal charge is output as a video signal via the horizontal transfer path 25. This operation is similar to that in the case of the first field.

Signal charge that has accumulated in the photodiodes 22 of the (m+1)th and (m+2)th rows is output in the first field and signal charge that has accumulated in the photodiodes 22 of the (m+3)th and (m+4)th rows is output in the second field. Interlaced read-out is thus achieved. Further, the video signal output from the image sensing device 3 is such that the number of pixels in the vertical direction is subsampled to one-half in each of the first and second fields.

Figure 21:
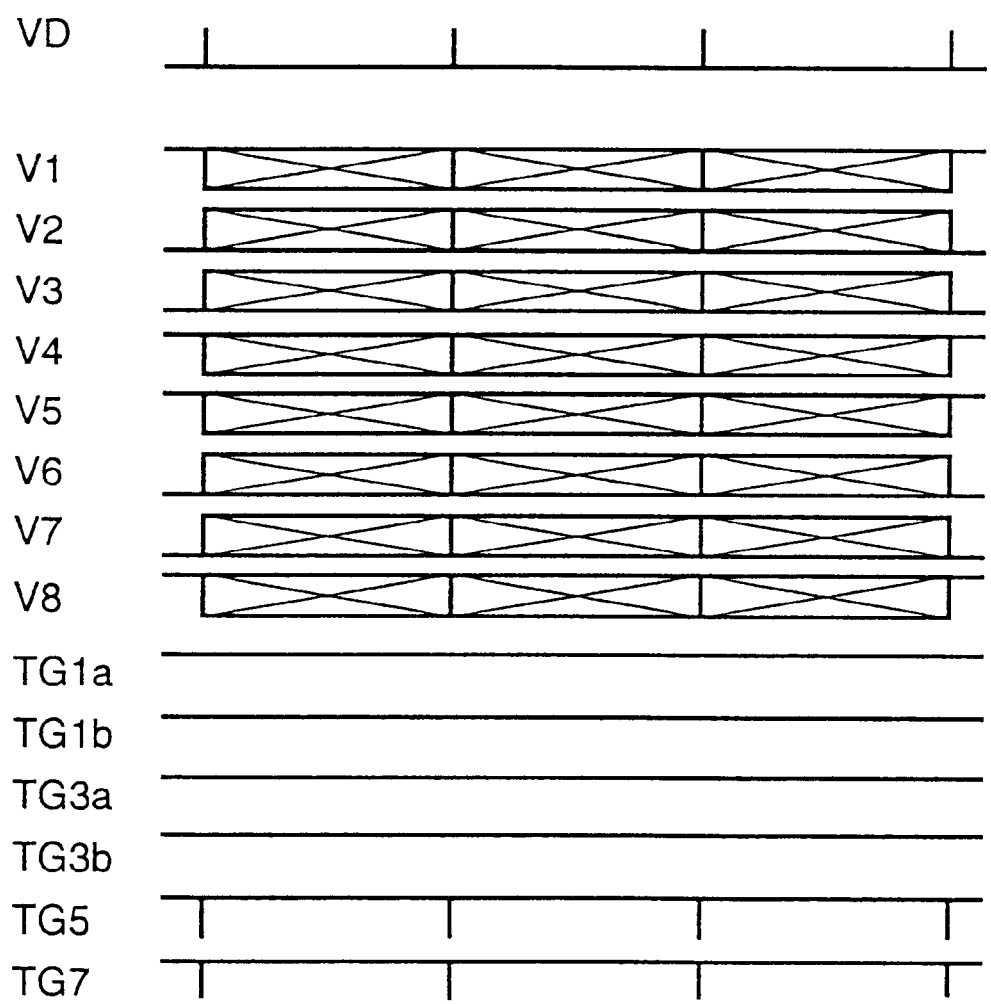
FIG. 21 is a time chart illustrating the relationship among a vertical synchronizing signal, vertical transfer pulses and transfer gate pulses.

FIGS. 20 and 21 illustrate third read-out processing when a video signal is read out of the image sensing device 3 shown in FIG. 2. In third read-out processing, signal charge that has been stored in the photodiodes 22 of (m+3)th and (m+4)th rows is read out (this is the same as signal read-out of the second field in second read-out processing). Read-out which subsamples pixels to one-half in the vertical direction is performed.

FIG. 20 is a diagram illustrating the relationship between vertical transfer electrodes and vertical drive pulses φVn applied to these vertical transfer electrodes, and FIG. 21 is a time chart which prevails at read-out of signal charge that has accumulated in photodiodes 22 of the (m+3)th and (m+4)th rows.

Transfer gate pulses TG5 and TG7 are applied to the vertical transfer electrodes ES and E7 at the vertical synchronization interval. As a result, signal charge that has accumulated in the photodiodes 22 of the (m+3)th and (m+4)th rows is transferred to the vertical transfer paths 20 from the photodiodes 22, as illustrated in FIG. 17. Pixels are subsampled to one-half in the vertical direction.

Figure 23:
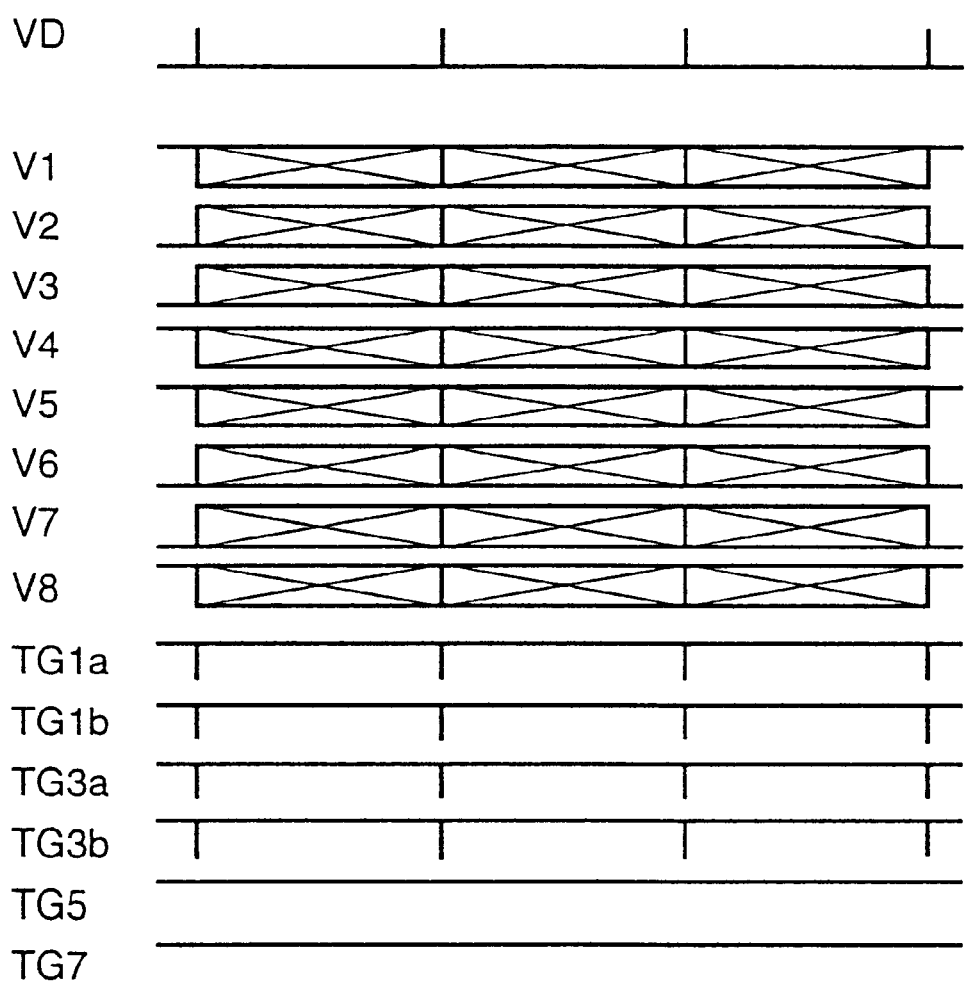
FIG. 23 is a time chart illustrating the relationship among a vertical synchronizing signal, vertical transfer pulses and transfer gate pulses.

FIGS. 22 and 23 illustrate fourth read-out processing when a video signal is read out of the image sensing device 3 shown in FIG. 2. In fourth read-out processing, signal charge that has been stored in the photodiodes 22 of (m+1)th and (m+2)th rows is read out. Pixels are subsampled to one-half in the vertical direction in a manner similar to that of the read-out processing illustrated in FIGS. 20 and 21.

FIG. 22 is a diagram illustrating the relationship between vertical transfer electrodes and vertical drive pulses φVn applied to these vertical transfer electrodes, and FIG. 23 is a time chart which prevails at read-out of signal charge that has accumulated in photodiodes 22 of the (m+1)th and (m+2)th rows.

Transfer gate pulses TG1a, TG1b, TG3a and TG3b are applied to the vertical transfer electrodes E1a, E1b, E3a and E3b at the vertical synchronization interval VD. As a result, signal charge that has accumulated in the photodiodes 22 of the (m+1)th and (m+2)th rows is transferred to the vertical transfer paths 20 from the photodiodes 22, as illustrated in FIG. 14. Pixels are subsampled to one-half in the vertical direction.

FIGS. 24 to 32 illustrate fifth read-out processing. In fifth read-out processing, signal charge that has been stored in photodiodes 22 of the (m+1)th row is read out in the first field, signal charge that has been stored in the photodiodes 22 of the (m+2)th row is read out in the second field, signal charge that has been stored in the photodiodes 22 of the (m+3)th row is read out in the third field, and signal charge that has been stored in the photodiodes 22 of the (m+4)th row is read out in the fourth field.

Figure 25:
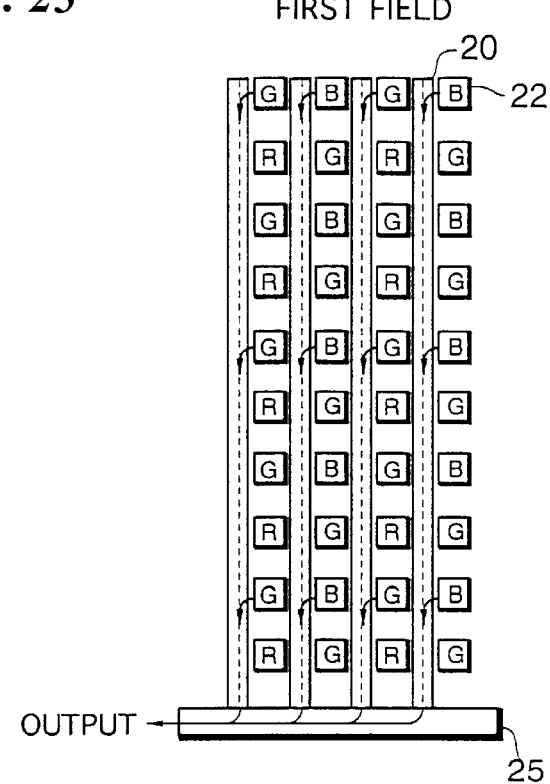
FIG. 25 is a diagram illustrating part of an image sensing device.
Figure 26:
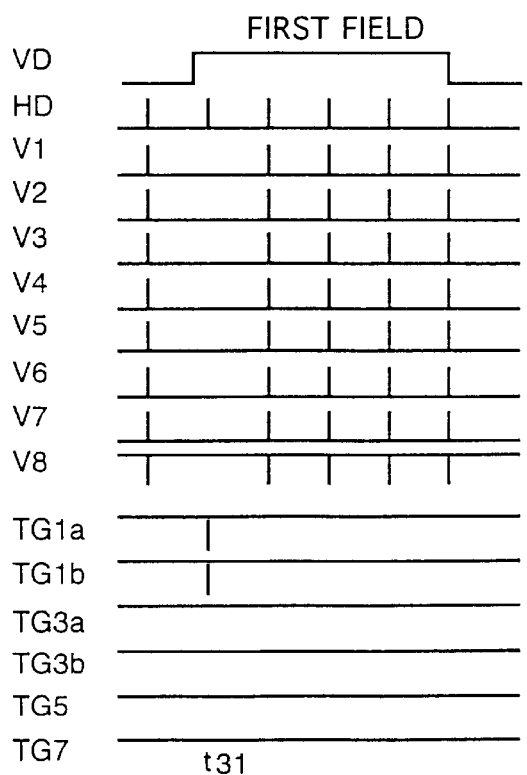
FIG. 26 is a time chart illustrating the relationship among a vertical synchronizing signal, vertical transfer pulses and transfer gate pulses.

FIG. 24 is a diagram illustrating the relationship between vertical transfer electrodes and vertical drive pulses φVn applied to these vertical transfer electrodes, FIG. 25 is a diagram illustrating part of the image sensing device 3 and shows the manner in which signal charge, which has accumulated in the photodiodes 22 of the (m+1)th row, is read out, and FIG. 26 is a time chart which prevails at read-out of signal charge that has accumulated in the photodiodes 22 of the (m+1)th row.

Figure 27:
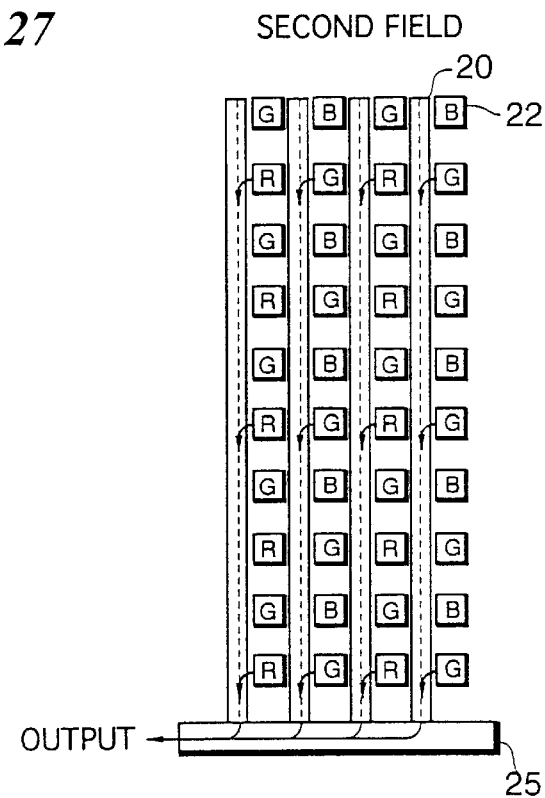
FIG. 27 is a diagram illustrating part of an image sensing device.
Figure 28:
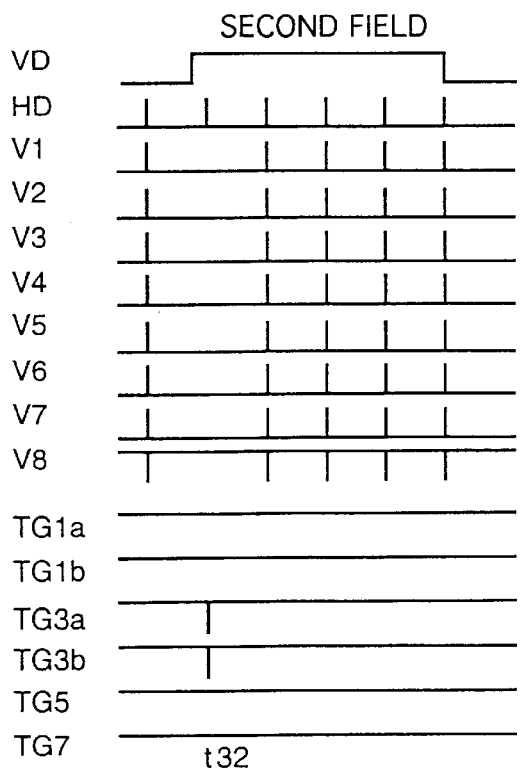
FIG. 28 is a time chart illustrating the relationship among a vertical synchronizing signal, vertical transfer pulses and transfer gate pulses.

FIG. 27 is a diagram illustrating part of the image sensing device 3 and shows the manner in which signal charge, which has accumulated in the photodiodes 22 of the (m+2)th row, is read out, and FIG. 28 is a time chart which prevails at read-out of signal charge that has accumulated in the photodiodes 22 of the (m+1)th row.

Figure 29:
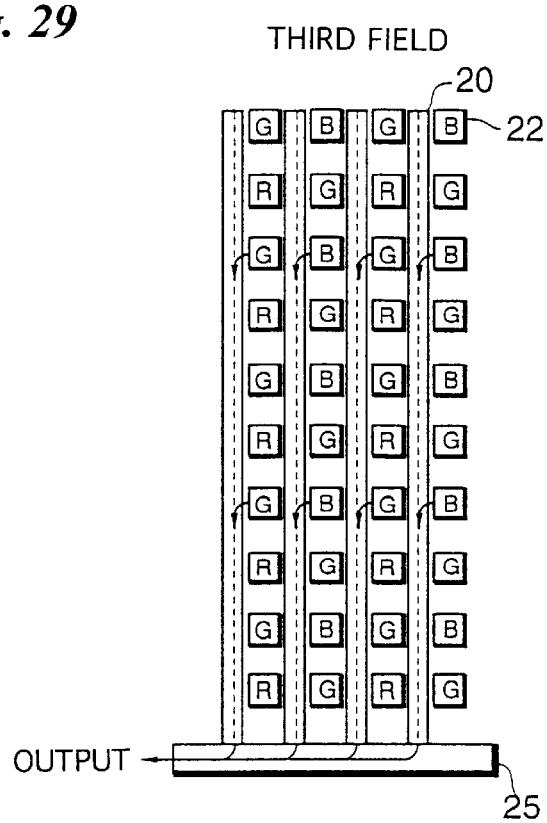
FIG. 29 is a diagram illustrating part of an image sensing device.
Figure 30:
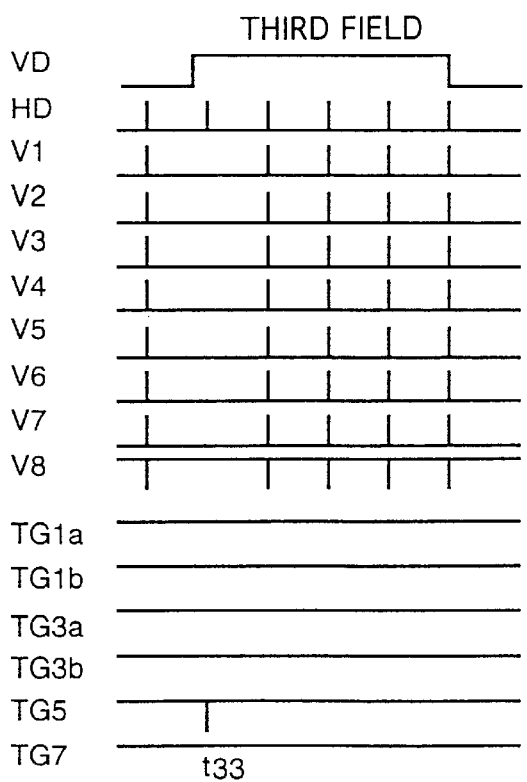
FIG. 30 is a time chart illustrating the relationship among a vertical synchronizing signal, vertical transfer pulses and transfer gate pulses.

FIG. 29 is a diagram illustrating part of the image sensing device 3 and shows the manner in which signal charge, which has accumulated in the photodiodes 22 of the (m+3)th row, is read out, and FIG. 30 is a time chart which prevails at read-out of signal charge that has accumulated in the photodiodes 22 of the (m+3)th row.

Figure 31:
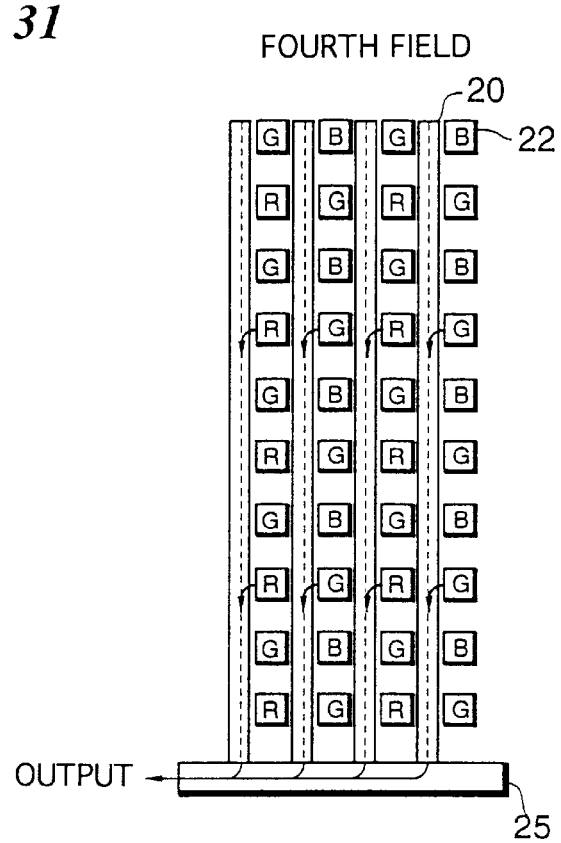
FIG. 31 is a diagram illustrating part of an image sensing device.
Figure 32:
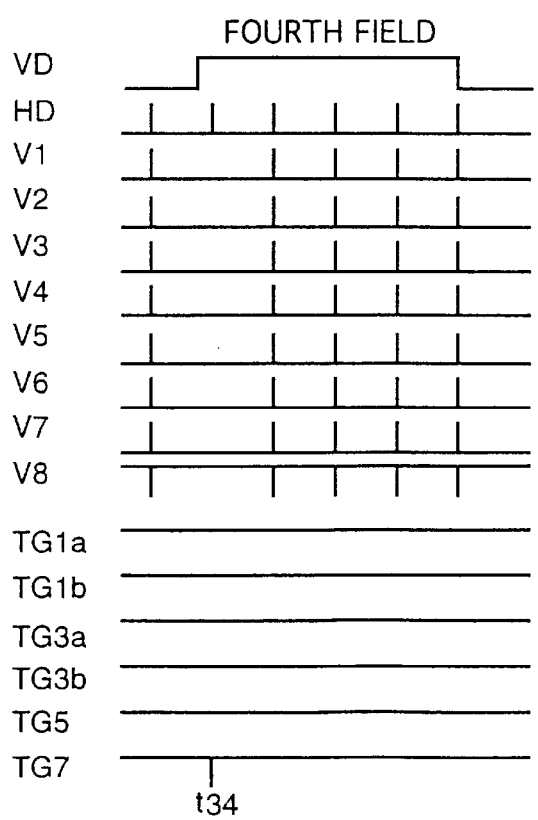
FIG. 32 is a time chart illustrating the relationship among a vertical synchronizing signal, vertical transfer pulses and transfer gate pulses.

FIG. 31 is a diagram illustrating part of the image sensing device 3 and shows the manner in which signal charge, which has accumulated in the photodiodes 22 of the (m+4)th row, is read out, and FIG. 32 is a time chart which prevails at read-out of signal charge that has accumulated in the photodiodes 22 of the (m+4)th row.

In the first field, transfer gate pulses TG1a and TG1b are applied to the vertical transfer electrodes E1a and E1b at time t31, as shown in FIGS. 24 to 26. As a result, signal charge that has accumulated in the photodiodes 22 of the (m+1)th row is transferred to the vertical transfer paths 20 and then read out.

In the second field, transfer gate pulses TG3a and TG3b are applied to the vertical transfer electrodes E3a and E3b at time t32, as shown in FIGS. 24, 27 and 28. As a result, signal charge that has accumulated in the photodiodes 22 of the (m+2)th row is transferred to the vertical transfer paths 20 and then read out.

In the third field, the transfer gate pulse TG5 is applied to the vertical transfer electrodes E5 at time t33, as shown in FIGS. 24, 29 and 30. As a result, signal charge that has accumulated in the photodiodes 22 of the (m+3)th row is transferred to the vertical transfer paths 20 and then read out.

In the fourth field, the transfer gate pulse TG7 is applied to the vertical transfer electrodes E7 at time t34, as shown in FIGS. 24, 31 and 32. As a result, signal charge that has accumulated in the photodiodes 22 of the (m+4)th row is transferred to the vertical transfer paths 20 and then read out.

Thus, signal charge is read out upon performing subsampling to one-fourth the number of pixels in the vertical direction in each of the first through fourth fields.

FIG. 33 illustrates sixth read-out processing and shows the relationship between vertical transfer electrodes and vertical drive pulses φVn applied to these vertical transfer electrodes.

In the first field, signal charge that has accumulated in the photodiodes 22 of the (m+3)th row is transferred to the vertical transfer paths 20 and read out by applying the transfer gate pulse TG5 to the vertical transfer electrodes E5. In the second field, signal charge that has accumulated in the photodiodes 22 of the (m+4)th row is transferred to the vertical transfer paths 20 and read out by applying the transfer gate pulse TG7 to the vertical transfer electrodes E7. Thus, processing for subsampling to one-fourth the number of pixels is executed in regard to the vertical direction in each of these fields.

FIG. 34 illustrates seventh read-out processing and shows the relationship between vertical transfer electrodes and vertical drive pulses φVn applied to these vertical transfer electrodes.

In the first field, signal charge that has accumulated in the photodiodes 22 of the (m+1)th row is transferred to the vertical transfer paths 20 and read out by applying the transfer gate pulses TG1a and TG1b to the vertical transfer electrodes E1a and E1b. In the second field, signal charge that has accumulated in the photodiodes 22 of the (m+4)th row is transferred to the vertical transfer paths 20 and read out by applying the transfer gate pulse TG7 to the vertical transfer electrodes E7. Thus, processing for subsampling to one-fourth the number of pixels is executed in regard to the vertical direction in each of these fields.

FIGS. 35 to 38 illustrate eighth read-out processing. This is signal-charge read-out processing for when subsampling to one-eighth the number of pixels in the vertical direction is performed.

FIG. 35 is a diagram illustrating the relationship between vertical transfer electrodes and vertical drive pulses φVn applied to these vertical transfer electrodes.

Figure 36:
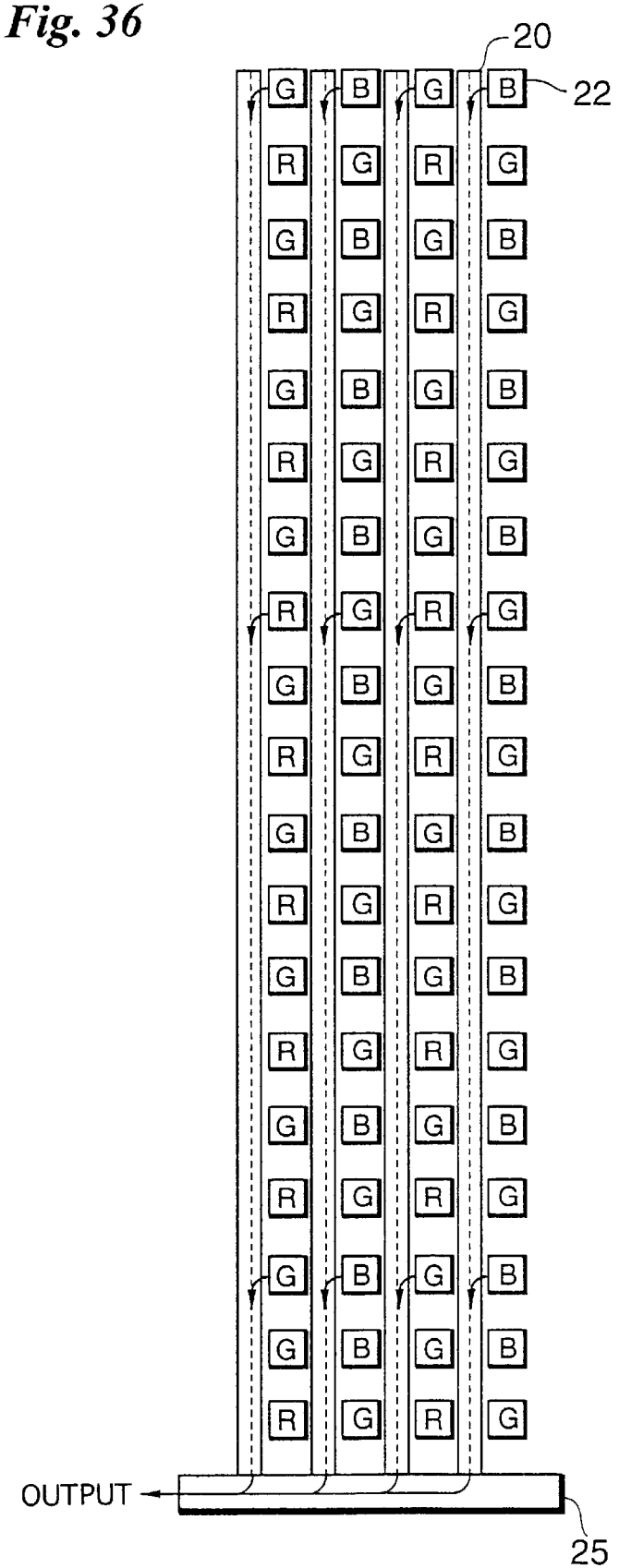
FIG. 36 is a diagram illustrating the relationship between vertical transfer electrodes and vertical drive pulses applied to these vertical transfer electrodes.
Figure 37:
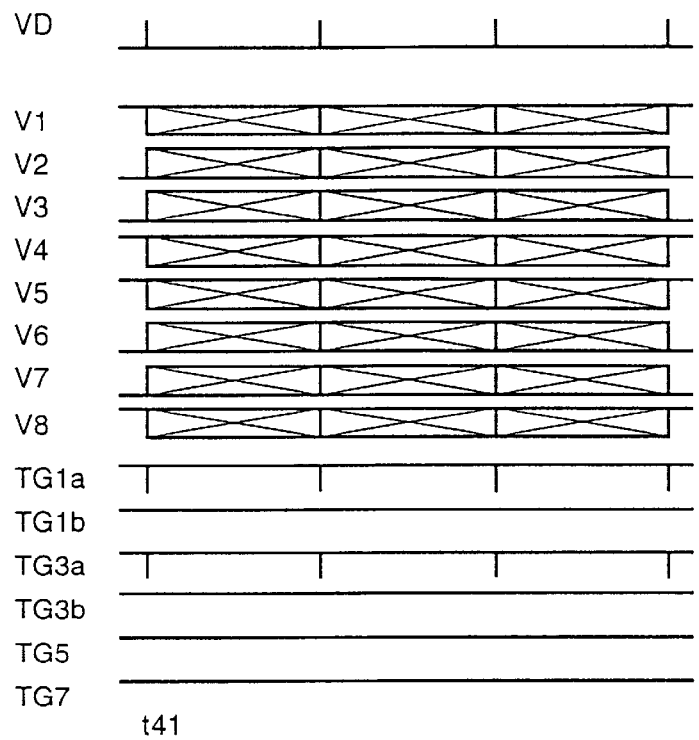
FIG. 37 is a time chart illustrating the relationship among a vertical synchronizing signal, vertical transfer pulses and transfer gate pulses.
Figure 38:
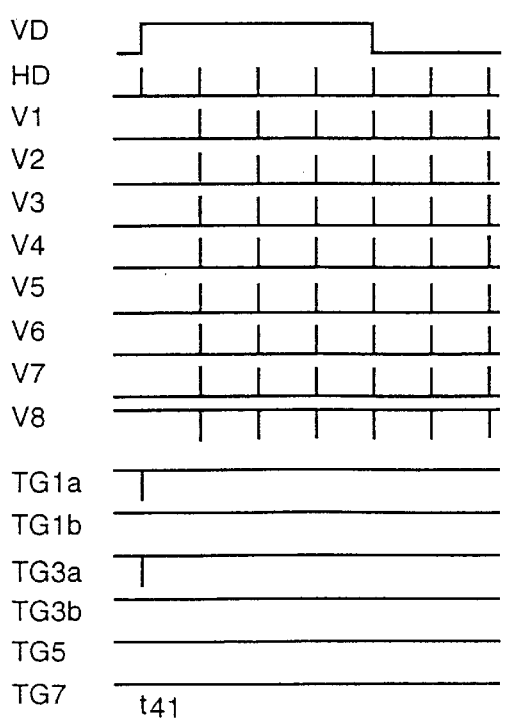
FIG. 38 shows the time chart of FIG. 37 in partially enlarged form.

FIG. 36 is a diagram illustrating part of the image sensing device 3 and shows the manner in which the number of pixels is subsampled to one-eighth in the vertical direction, FIG. 37 is a time chart illustrating the relationship among the vertical synchronizing signal, vertical transfer pulses and transfer gate pulses when the number of pixels is subsampled to one-eighth in the vertical direction, and FIG. 38 shows the time chart of FIG. 37 in partially enlarged form (in the vicinity of time t41).

Transfer gate pulses TG1a and TG3a are applied to the vertical transfer electrodes E1a and E3a in sync with the vertical synchronizing signal VD (i.e., at time t41); transfer gate pulses are not applied to any other vertical transfer electrodes. Signal charge that has accumulated in the photodiodes 22 of (n+1)th and (n+9)th rows can be read out and subsampling the number of pixels to one-eighth in the vertical direction can be achieved.

By constructing the image sensing device 3 in the manner shown in FIG. 3, it is possible to read-out one-half the number of pixels, one-fourth the number of pixels and one-eighth the number of pixels in the vertical direction. Of course, it is also possible to read out all pixels. An arrangement is adopted in which these read-out schemes can be selected, and read-out processing may be executed in dependence upon the selection.

As many apparently widely different embodiments of the present invention can be made without departing from the spirit and scope thereof, it is to be understood that the invention is not limited to the specific embodiments thereof except as defined in the appended claims.

What is claimed is:

1. A solid-state electronic image sensing device having:
   a number of photodiodes formed in row and column directions;
   vertical transfer paths formed adjacent to photodiodes in the row direction and in which vertical transfer electrodes have been formed; and
   transfer gates for transferring signal charge, which has accumulated in said photodiodes, to said vertical transfer paths;
   wherein signal lines for applying gate pulses to said transfer gates are connected so as to apply gate pulses simultaneously to transfer gates for photodiodes of (n+1)th, (n+5)th and (n+13)th rows, apply gate pulses simultaneously to transfer gates for photodiodes of an (n+2)th row, apply gate pulses simultaneously to transfer gates for photodiodes of (n+3)th, (n+7)th, (n+11)th and (n+15)th rows, apply gate pulses simultaneously to transfer gates for photodiodes of (n+4)th, (n+8)th, (n+12)th and (n+16)th rows, apply gate pulses simultaneously to transfer gates for photodiodes of (n+6)th, (n+10)th and (n+14)th rows, and apply gate pulses simultaneously to transfer gates for photodiodes of an (n+9)th row.

2. The device according to claim 1, further comprising a first gate-pulse output device for applying gate pulses in such a manner that application of gate pulses to transfer gates for photodiodes of odd-numbered rows is performed in a field different from that in which application of gate pulses to transfer gates for photodiodes of even-numbered rows is performed.

3. The device according to claim 1, further comprising a second gate-pulse output device for applying gate pulses simultaneously to transfer gates for photodiodes in two rows among (m+1)th, (m+2)th, (m+3)th and (m+4)th rows in odd-numbered fields and applying gate pulses simultaneously to transfer gates for photodiodes of (m+1)th, (m+2)th, (m+3)th and (m+4)th rows in even-numbered fields with the exception of those transfer gates of rows to which gate pulses were applied in the odd-numbered fields.

4. The device according to claim 1, further comprising a third gate-pulse output device for applying gate pulses simultaneously to transfer gates for photodiodes in one or two rows among (m+1)th, (m+2)th, (m+3)th and (m+4)th rows.

5. The device according to claim 1, further comprising a fourth gate-pulse output device for applying gate pulses simultaneously to transfer gates for photodiodes in (n+2)th and (n+9)th rows.

6. A method of controlling the operation of a solid-state electronic image sensing device having a number of photodiodes formed in row and column directions, vertical transfer paths formed adjacent to photodiodes in the row direction and in which vertical transfer electrodes have been formed, and transfer gates for transferring signal charge, which has accumulated in said photodiodes, to said vertical transfer paths, said method comprising the steps of:
   applying gate pulses simultaneously to transfer gates for photodiodes of (n+1)th, (n+5)th and (n+13)th rows;
   applying gate pulses simultaneously to transfer gates for photodiodes of an (n+2)th row;
   applying gate pulses simultaneously to transfer gates for photodiodes of (n+3)th, (n+7)th, (n+11)th and (n+15)th rows;
   applying gate pulses simultaneously to transfer gates for photodiodes of (n+4)th, (n+8)th, (n+12)th and (n+16)th rows;
   applying gate pulses simultaneously to transfer gates for photodiodes of (n+6)th, (n+10)th and (n+14)th rows; and
   applying gate pulses simultaneously to transfer gates for photodiodes of an (n+9)th row.

* * * * *